(12) United States Patent
Kudelka et al.

(10) Patent No.: US 7,189,614 B2
(45) Date of Patent: Mar. 13, 2007

(54) METHOD FOR FABRICATING A TRENCH STRUCTURE WHICH IS ELECTRICALLY CONNECTED TO A SUBSTRATE ON ONE SIDE VIA A BURIED CONTACT

(75) Inventors: Stephan Kudelka, Ottendorf-Okrilla (DE); Albrecht Kieslich, Radebeul (DE); Kevin Pears, Dreseden (DE)

(73) Assignee: Infineon Technologies AG, Munich (DE)

( * ) Notice: Subject to any disclaimer, the term of this patent is extended or adjusted under 35 U.S.C. 154(b) by 249 days.

(21) Appl. No.: 10/886,053

(22) Filed: Jul. 8, 2004

(65) Prior Publication Data
US 2005/0032324 A1 Feb. 10, 2005

(30) Foreign Application Priority Data
Jul. 9, 2003 (DE) ................. 103 31 030

(51) Int. Cl.
*H01L 21/8242* (2006.01)
(52) U.S. Cl. ........................ 438/243; 438/386
(58) Field of Classification Search ........ 438/243–248, 438/386–392
See application file for complete search history.

(56) References Cited

U.S. PATENT DOCUMENTS

| 4,157,269 A * | 6/1979 | Ning et al. ................. 438/359 |
| 6,426,253 B1 | 7/2002 | Tews et al. |
| 6,498,061 B2 | 12/2002 | Divakaruni et al. |
| 6,936,512 B2 * | 8/2005 | Chudzik et al. ............ 438/243 |
| 2005/0191564 A1 * | 9/2005 | Huang et al. .................. 430/5 |

* cited by examiner

*Primary Examiner*—Tuan H. Nguyen
(74) *Attorney, Agent, or Firm*—Morrison & Foerster LLP

(57) ABSTRACT

A method for fabricating a trench structure, in particular a trench capacitor with an insulation collar, which is electrically connected to a substrate on one side via a buried contact. Fabrication includes, for example, providing a trench in the substrate using a hard mask with a corresponding mask opening; providing an at least partial trench filling; providing a liner on the resulting structure; carrying out an oblique implantation of impurity ions onto the liner for altering the etching properties of an implanted partial region of the liner; selectively removing the implanted partial region of the liner by a first etching for forming a liner mask from the complimentary partial region of the liner, which partially masks the top side of the trench filling; removing a part of the trench filling by a second etching using the liner mask; and replacing the removed part of the trench filling.

8 Claims, 32 Drawing Sheets

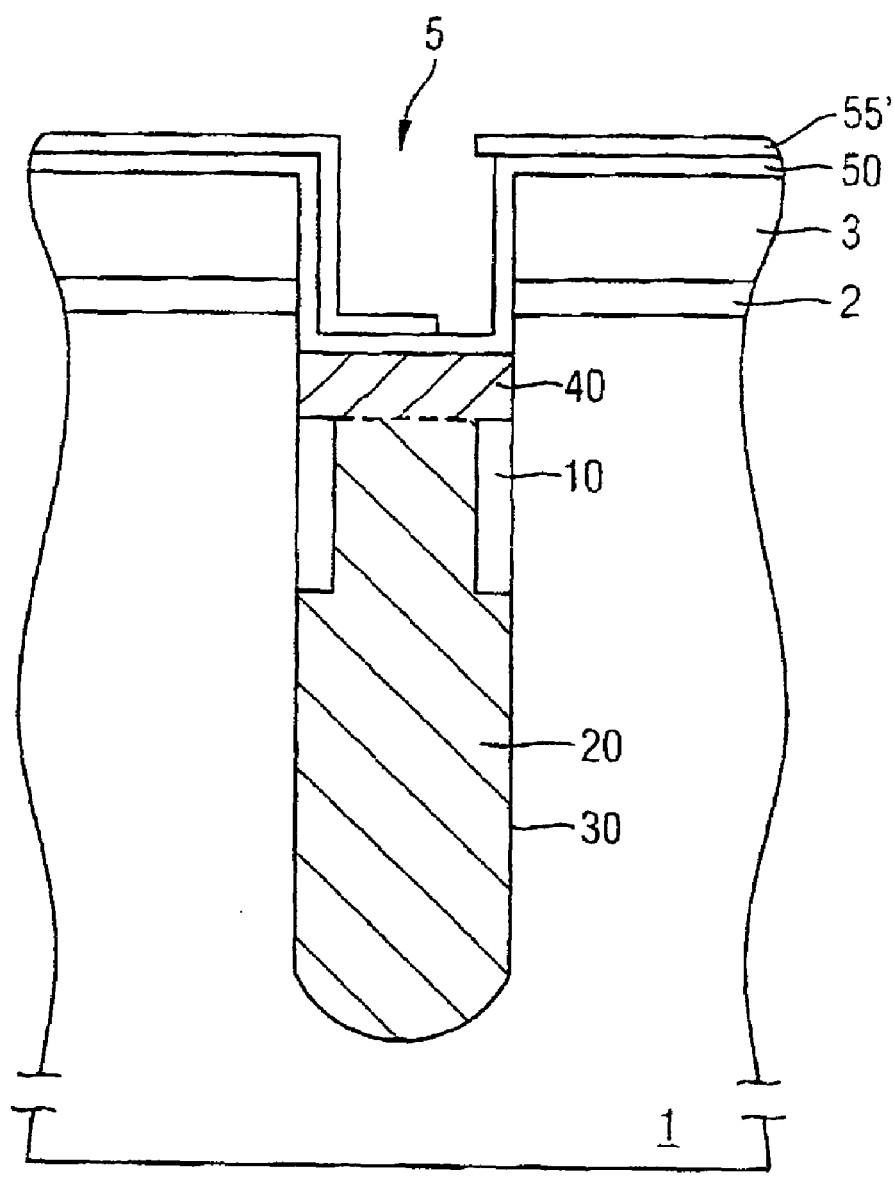

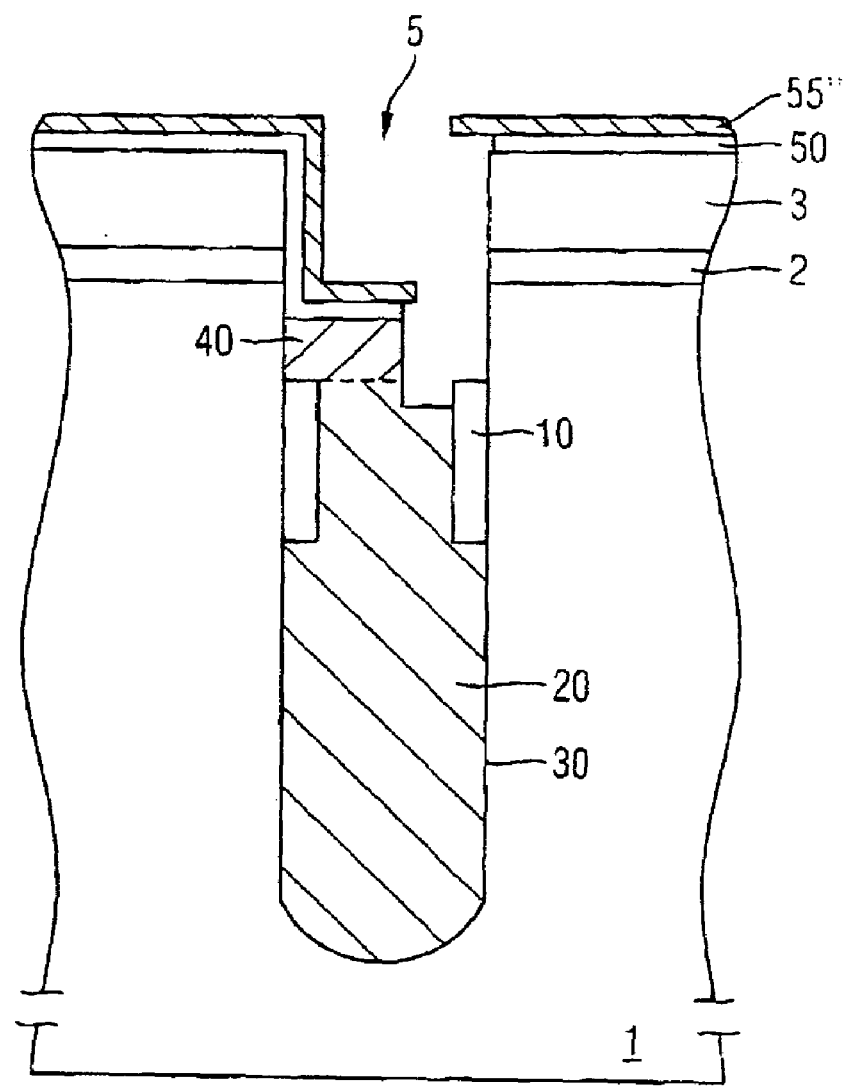

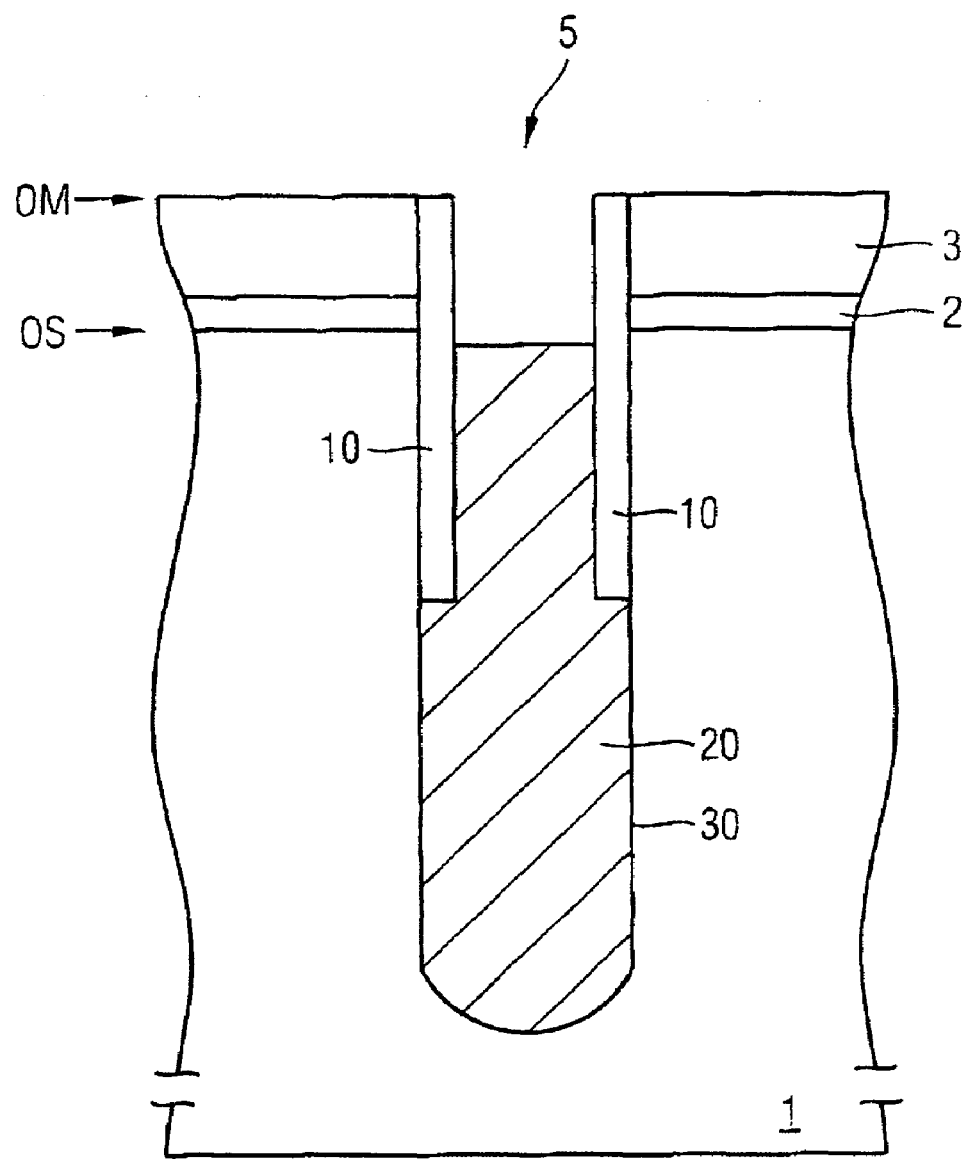

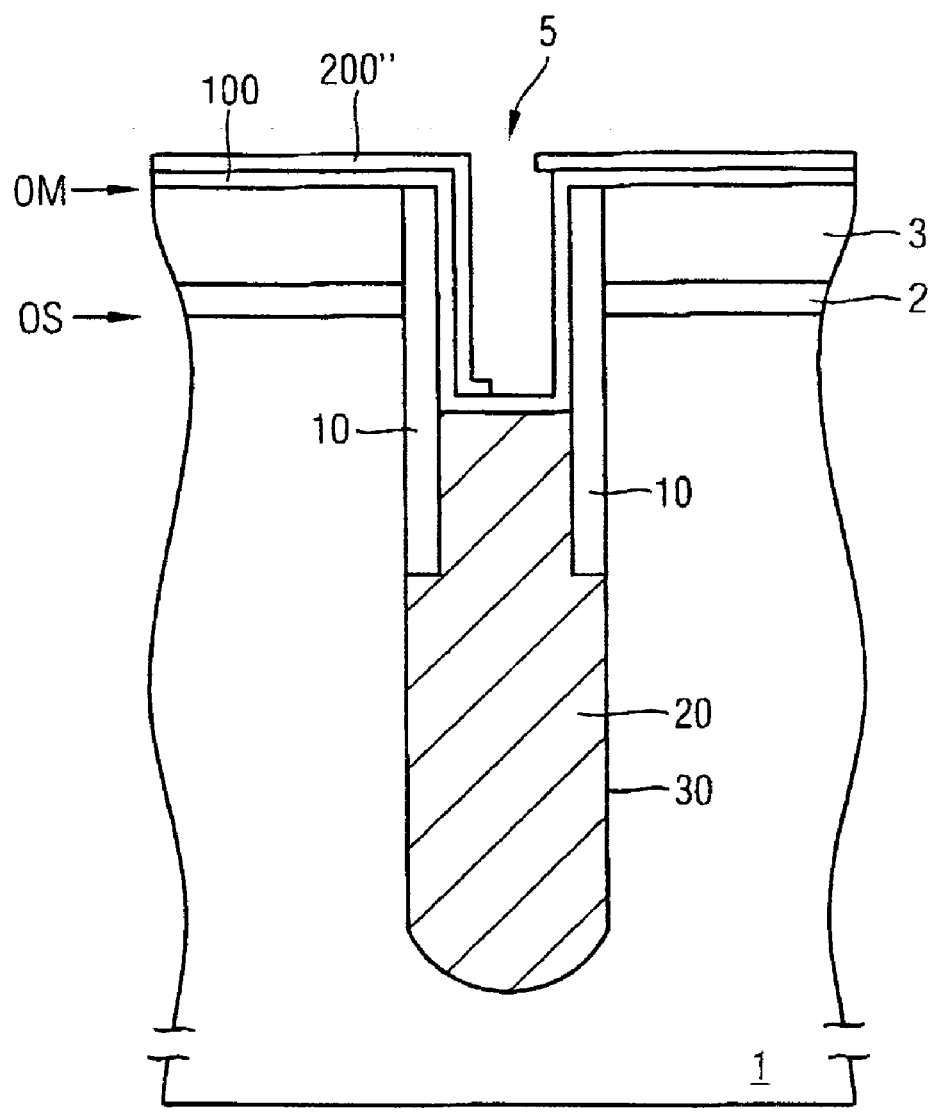

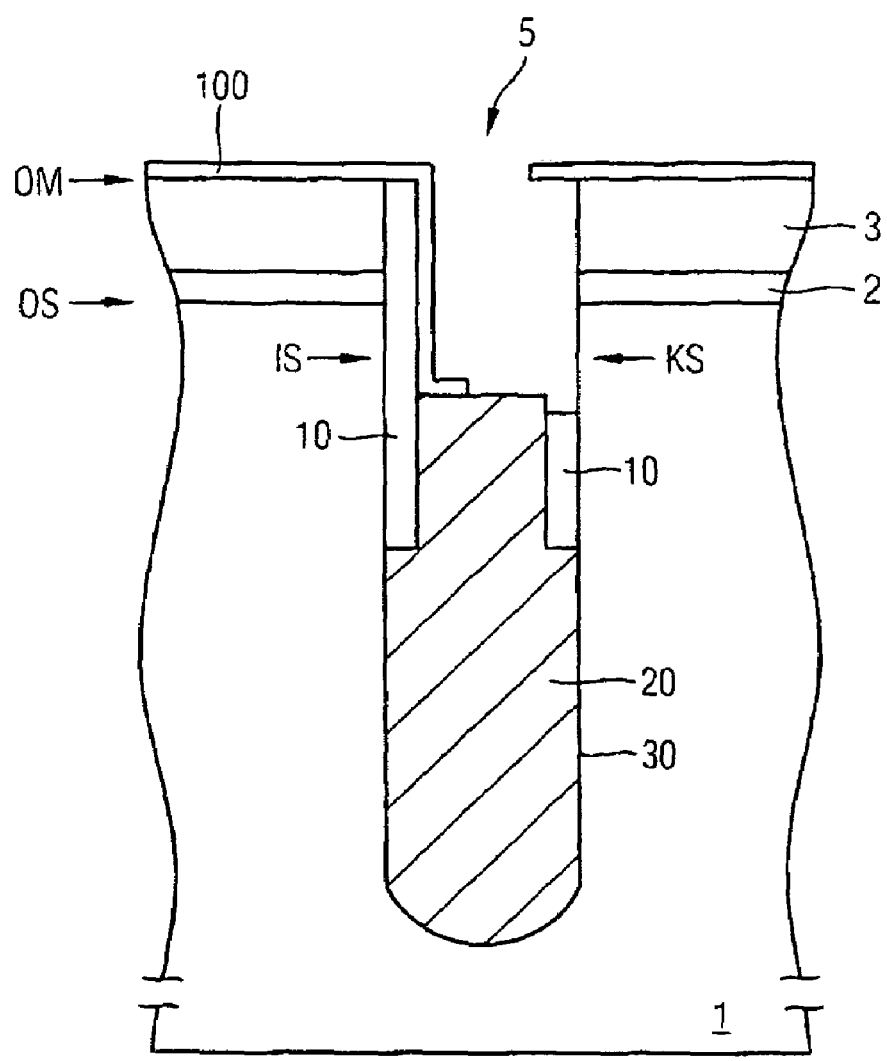

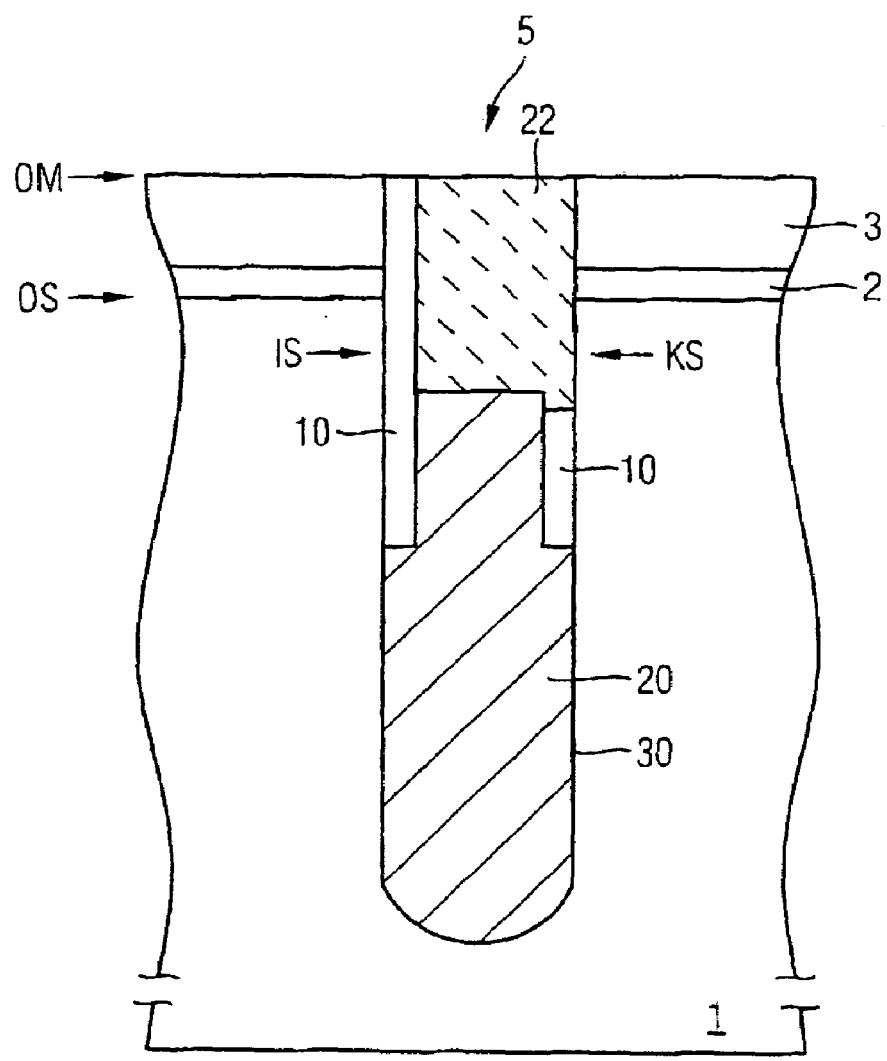

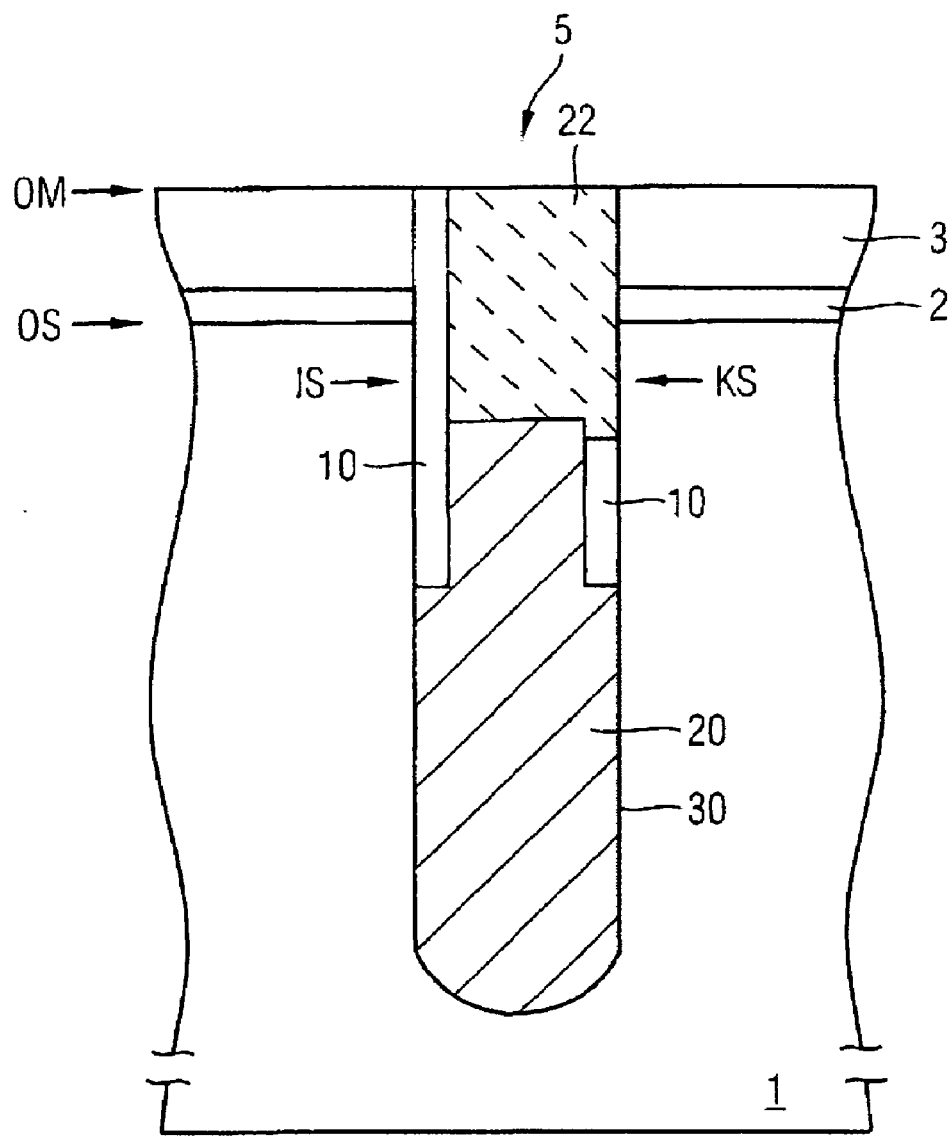

METHOD FOR FABRICATING A TRENCH STRUCTURE WHICH IS ELECTRICALLY CONNECTED TO A SUBSTRATE ON ONE SIDE VIA A BURIED CONTACT

CLAIM FOR PRIORITY

This application claims priority to German Application No. 103 31 030.4 filed Jul. 9, 2003, which is incorporated herein, in its entirety, by reference.

TECHNICAL FIELD OF THE INVENTION

The present invention relates to a method for fabricating a trench structure, in particular a trench capacitor with an insulation collar, which is electrically connected to a substrate on one side via a buried contact.

BACKGROUND OF THE INVENTION

Although applicable in principle to any desired integrated circuits, the present invention and the problem area on which it is based are explained with regard to integrated memory circuits in silicon technology.

FIG. 1 shows a diagrammatic sectional illustration of a semiconductor memory cell with a trench capacitor and a planar selection transistor connected thereto.

In FIG. 1, reference symbol 1 designates a silicon semiconductor substrate. Provided in the semiconductor substrate 1 are trench capacitors GK1, GK2 having trenches G1, G2, the electrically conductive fillings 20a, 20b of which form first capacitor electrodes. The conductive fillings 20a, 20b are insulated in the lower and central trench region by a dielectric 30a, 30b from the semiconductor substrate 1, which, for its part, forms the second capacitor electrodes (if appropriate in the form of a buried plate (not shown)).

Provided in the central and upper region of the trenches G1, G2 are peripheral insulation collars 10a, 10b, above which are provided buried contacts 15a, 15b, which are in electrical contact with the conductive fillings 20a, 20b and the adjoining semiconductor substrate 1. The buried contacts 15a, 15b are connected to the semiconductor substrate 1 only on one side (cf. FIGS. 2a, b). Insulation regions 16a, 16b insulate the other side of the substrate from the buried contacts 15a, 15b or insulate the buried contacts 15a, 15b toward the top side of the trenches G1, G2.

This enables a very high packing density of the trench capacitors GK1, GK2 and of the associated selection transistors, which will now be explained. In this case, reference is made principally to the selection transistor which is associated with the trench capacitor GK2, since only the drain region D1 or the source region S3, respectively, of adjacent selection transistors is depicted. The selection transistor associated with the trench capacitor GK2 has a source region S2, a channel region K2 and a drain region D2. The source region S2 is connected via a bit line contact BLK to a bit line (not shown) arranged above an insulation layer I. The drain region D2 is connected to the buried contact 15b on one side. A word line WL2 having a gate stack GS2 and a gate insulator GI2 surrounding the latter runs above the channel region K2. The word line WL2 is an active word line for the selection transistor of the trench capacitor GK2.

Running parallel adjacent to the word line WL2 are word lines WL1 comprising gate stack GS1 and gate insulator GI1 and word line WL3 comprising gate stack GS3 and gate insulator GI3, which are passive word lines for the selection transistor of the trench capacitor GK2. Said word lines WL1, WL3 serve for driving selection transistors which are displaced in the third dimension with respect to the sectional illustration shown.

FIG. 1 illustrates the fact that this type of connection on one side of the buried contact enables the trenches and the adjacent source regions or drain regions of relevant selection transistors to be arranged directly beside one another. As a result, the length of a memory cell may amount to just 4 F and the width to just 2 F, where F is the minimum length unit that can be realized technologically (cf. FIGS. 2a, b).

FIG. 2A shows a plan view of a memory cell array with memory cells in accordance with FIG. 1 in a first arrangement possibility.

Reference symbol DT in FIG. 2A designates trenches which are arranged rowwise at a distance of 3 F from one another and columnwise at a distance of 2 F. Adjacent rows are displaced by 2 F relative to one another. UC in FIG. 2A designates the area of a unit cell, which amounts to 4 F×2 F=8 $F^2$. STI designates isolation trenches which are arranged at a distance of 1 F from one another in the row direction and insulate adjacent active regions from one another. Bit lines BL likewise run at a distance of 1 F from one another in the row direction, whereas the word lines run at a distance of 1 F from one another in the column direction. In this arrangement example, all the trenches DT have a contact region KS of the buried contact to the substrate on the left-hand side and an insulation region IS on the right-hand side (regions 15a, b and 16a, b, respectively, in FIG. 1).

FIG. 2B shows a plan view of a memory cell array with memory cells in accordance with FIG. 1 in a second arrangement possibility.

In this second arrangement possibility, the rows of trenches have alternating connection regions and insulation regions of the buried contacts, respectively. Thus, in the bottommost row of FIG. 2B, the buried contacts are in each case provided with a contact region KS1 on the left-hand side and with an insulation region IS1 on the right-hand side. By contrast, in the row located above that, all the trenches DT are provided with each insulation region IS2 on the left-hand side and with a contact region KS2 on the right-hand side. This arrangement alternates in the column direction.

In the text below, for reasons of clarity, a portrayal of the fabrication of the planar selection transistors is dispensed with and only the formation of the buried contact of the trench capacitor, which buried contact is connected on one side, is discussed in detail. Unless expressly mentioned otherwise, the steps of fabricating the planar selection transistors are the same as in the prior art.

FIGS. 3A–G are diagrammatic illustrations of successive method stages of a first exemplary method for fabricating a trench capacitor with an insulation collar, which is electrically connected to a substrate on one side via a buried contact.

In FIG. 3A, reference symbol 5 designates a trench provided in the silicon semiconductor substrate 1. Provided on the top side OS of the semiconductor substrate 1 is a hard mask comprising a pad oxide layer 2 and a pad nitride layer 3. A dielectric 30 is provided in the lower and central region of the trench 5, said dielectric insulating an electrically conductive filling 20 from the surrounding semiconductor substrate 1.

A peripheral insulation collar 10 is provided in the upper and central region of the trench 5, the insulation collar being sunk into the trench 5 to exactly the same extent as the conductive filling 20. An exemplary material for the insulation collar 10 is silicon oxide, and polysilicon for the electrically conductive filling 20. However, other material combinations are also conceivable, of course.

A conductive filling 40 made of epitaxial polysilicon sunk under the top side OS is additionally provided. The conductive filling 40 thus represents a buried contact which is connected all around and is partly to be removed in this first example in order to form the later insulation region IS. In order, therefore, to realize the connection on one side of the region 40 to the semiconductor substrate 1, the "subtractive" method steps portrayed below are carried out.

In accordance with FIG. 3B, firstly a silicon nitride liner 50 is deposited and a liner 55 made of amorphous undoped silicon is deposited over that.

Afterward, with reference to FIG. 3C, an oblique implantation 11 is effected at a predetermined angle, for example 30°, BF2 being implanted into the region 55, of the liner 55 with the exception of a shaded region 60. The etching properties of the boron-doped region 55' of the liner 55 are thus altered, something which is utilized in accordance with FIG. 3D by the region 60 being selectively removed by means of a corresponding wet etching method in order to uncover the underlying silicon nitride liner 50.

With reference to FIG. 3E, the remaining implanted region 55' of the liner 55 is then wet-oxidized in order to attain a corresponding oxidized liner region 55". In the subsequent process step, using the oxidized implanted region 55" of the liner 55, a part of the silicon nitride liner 50 is removed from the surface of the conductive region 40 and from the sidewall of the trench 5 and of the hard mask 2, 3, respectively.

With reference to FIG. 3F, the conductive filling 40 and a part of the conductive filling 20 are subsequently etched using the region 55" as a mask.

In the case of the process state shown in FIG. 3F, a part of the region 40 serving as buried contact is thus removed and a corresponding upwardly and laterally insulating oxide filling 45 can then be provided at the corresponding location in the further course of the method by deposition and etching-back after the liners 50, 55 (55") have been removed from the surface, as is shown in FIG. 3G. This creates the buried contact with the connection region KS and the insulation region IS.

FIGS. 4A–I are diagrammatic illustrations of successive method stages of a second exemplary method for fabricating a trench capacitor with an insulation collar, which is electrically connected to a substrate on one side via a buried contact.

In FIG. 4A, reference symbols identical to those in FIG. 3A designate identical components.

In contrast to FIG. 3A, a peripheral insulation collar 10 is provided in the upper and central region of the trench 5 and also proceeding from there as far as the top side OM of the hard mask 3, which insulation collar is not sunk into the trench 5, whereas the electrically conductive filling 20 is sunk to a level below the top side OS of the substrate 1.

The conductive filling 40 is now in the upper in order to form the later connection region KS on one side. The "additive" method steps portrayed below are carried out for this purpose.

With reference to FIG. 4B, firstly a silicon nitride liner layer 100 is deposited over the structure of FIG. 4A and an undoped amorphous silicon liner layer 200 is deposited over that, which layers line the top side OM of the hard mask and also the walls and the bottom of the recess, but do not fill the region of the recess.

In a subsequent process step illustrated in FIG. 4C, an oblique implantation 12 of boron ions is effected in such a way that the polysilicon liner layer 200 is implanted at the top side OM of the hard mask and in approximately half of the recess at the wall and at the bottom, which is indicated by the dotting in FIG. 4C. In this case, 200' designates the implanted region of 200 and 201 designates the shaded region of 200.

In the subsequent process step shown in FIG. 4D, the undoped, non-implanted region 201 of the polysilicon liner layer 200 in the recess is then removed by means of a selective wet etching.

This is followed, as shown in FIG. 4E, by an oxidation of the doped polysilicon liner layer 200 for the formation of a silicon oxide liner layer 200".

In the subsequent process step, the uncovered region of the silicon nitride liner layer 100 is removed by means of a selective wet etching. This is shown in FIG. 4F.

With reference to FIG. 4G, a selective wet etching for the removal of silicon oxide is then effected in order to remove the silicon oxide liner layer 200' and the insulation collar 10 uncovered in the recess. This creates a connection region KS on one side in the trench 5 toward the silicon semiconductor substrate 1. An insulation region IS is provided on the other side, where the insulation collar 10 remains as shown in FIG. 4G. Although not shown here, the surface of the connection region KS is usually conditioned at this point, for example by means of an implantation.

With reference to FIG. 4H, a further electrically conductive filling 22 made of polysilicon is then deposited and polished back, so that the previously existing recess is filled again as far as the top side OM of the hard mask.

In subsequent process steps known per se, the insulation collar 10 is then sunk in the insulation region IS and in the further electrically conductive filling 22 to below the top side OS of the semiconductor substrate 1 and an insulation region 250 is deposited and sunk, the insulation region likewise preferably comprising silicon oxide.

The trench capacitor with a connection on one side as shown in FIG. 4I is thus completed.

It is noticeable in FIG. 4B that the aspect ratios for the two liner layers 100, 200 are significantly more critical in this second example than in the first example above and, therefore, the liner layers have to be made correspondingly thinner, e.g. the silicon nitride liner layer 100 with a thickness of approximately 20 nm and, above it, the undoped amorphous silicon liner layer 200 with a thickness of approximately 15 nm. In this case, these thickness values result in critical values which cannot be significantly further undershot without impairing the function of the liner.

SUMMARY OF THE INVENTION

The present invention specifies an improved method for fabricating such a trench capacitor connected on one side, a good process reliability being possible even with increasing aspect ratios.

One advantages of the method according to the invention is that it enables a precise definition of the connection region and, respectively, of the complimentary insulation region in the case of the respective buried contact of the trench capacitor. Both an additive creation of the buried contact (piecemeal construction) and a subtractive creation (piecemeal deconstruction) of the buried contact are made possible by the method according to the invention.

In one embodiment of the invention, there is a single-layered thin liner which enables a selective etching of the non-masked part of the trench filling and can itself be selectively removed, if necessary, after the etching.

In accordance with one preferred embodiment, as trench filling, provision is made of a capacitor dielectric in the lower and central trench region, an insulation collar in the central and upper trench region and an electrically conductive filling in the lower, central and upper trench region, the electrically conductive filling electrically contact-connecting the substrate in the upper trench region above the insulation collar and being sunk with respect to the top side of the substrate. The liner mask defines a contact region on one side and an insulation region on a different side of a buried contact, the insulation region of the buried contact being formed by replacing the removed part of the trench filling by an insulation material.

In accordance with a further preferred embodiment, as trench filling, provision is made of a capacitor dielectric in the lower and central trench region, an insulation collar in the central and upper trench region and as far as the top side of the hard mask opening, and an electrically conductive filling in the trench, which filling reaches as far as at least into the upper trench region with the insulation collar. The liner mask defines a contact region on one side and an insulation region on a different side of a buried contact, the contact region of the buried contact being formed by replacing the removed part of the trench filling by a further electrically conductive filling.

In accordance with a further preferred embodiment, the liner mask is removed before the replacement of the removed part of the trench filling.

In accordance with a further preferred embodiment, the liner comprises $Al_2O_3$.

In accordance with a further preferred embodiment, for removal, an oblique implantation of impurity ions onto the liner mask is once again carried out for altering the etching properties and the liner mask is subsequently removed by means of a third etching.

In accordance with a further preferred embodiment, the liner has a thickness of 15 to 25 nm.

In accordance with a further preferred embodiment, the liner is deposited and subsequently subjected to heat treatment.

In accordance with a further preferred embodiment, the implanted part of the liner is etched in an ammonia-containing etchant.

In accordance with a further preferred embodiment, the liner comprises $Al_2O_3$ and the liner mask is removed before the replacement of the removed part of the trench filling by means of hot phosphoric acid.

BRIEF DESCRIPTION OF THE DRAWINGS

Exemplary embodiments of the invention are illustrated in the drawings and explained in more detail in the description below.

In the figures:

FIGS. 3A–G show illustrations of successive method stages of a first exemplary method for fabricating a trench capacitor with an insulation collar, which is electrically connected to a substrate on one side via a buried contact.

FIGS. 4A–I show illustrations of successive method stages of a second exemplary method for fabricating a trench capacitor with an insulation collar, which is electrically connected to a substrate on one side via a buried contact.

FIGS. 6A–G show illustrations of successive method stages of a fabrication method as second embodiment of the present invention.

In the figures described below, identical reference symbols designate constituent parts identical or functionally identical to those in the figures described previously.

DETAILED DESCRIPTION OF THE INVENTION

FIGS. 5A–F show successive method stages of a fabrication method as first embodiment of the present invention.

Figure 1:
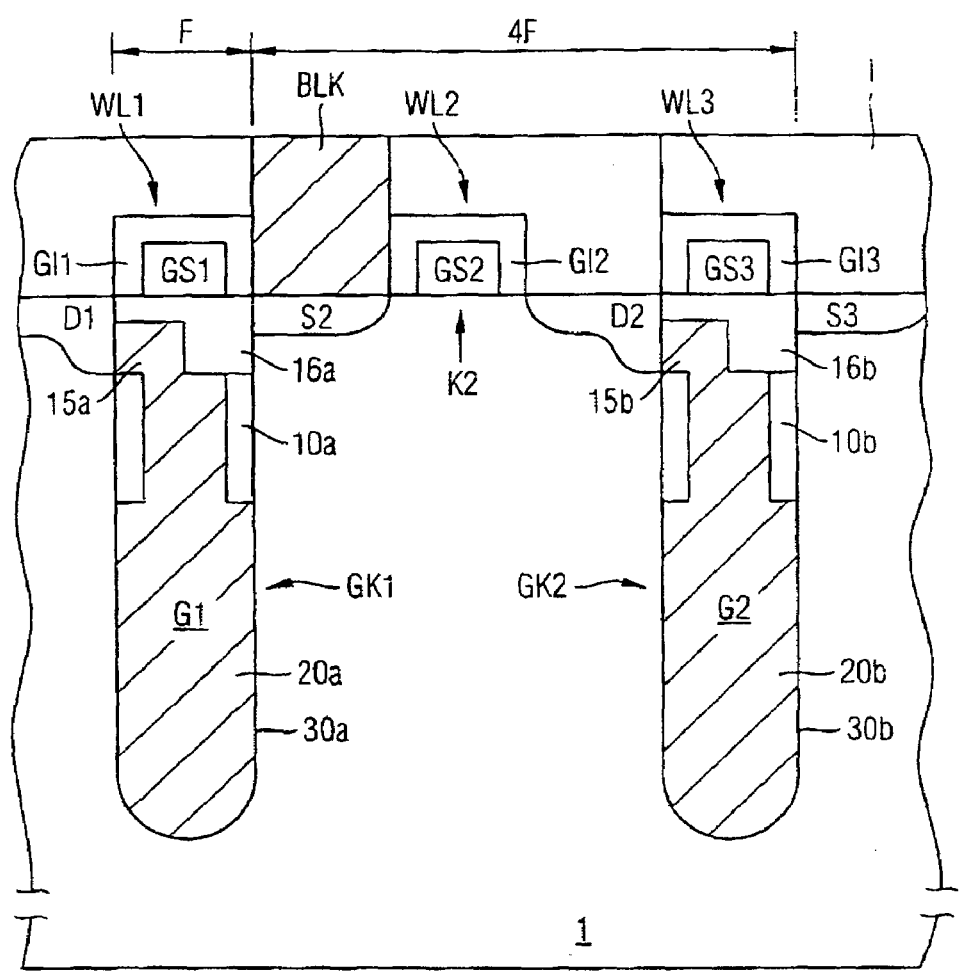
FIG. 1 shows a sectional illustration of a semiconductor memory cell with a trench capacitor and a planar selection transistor connected thereto.
Figure 2A:
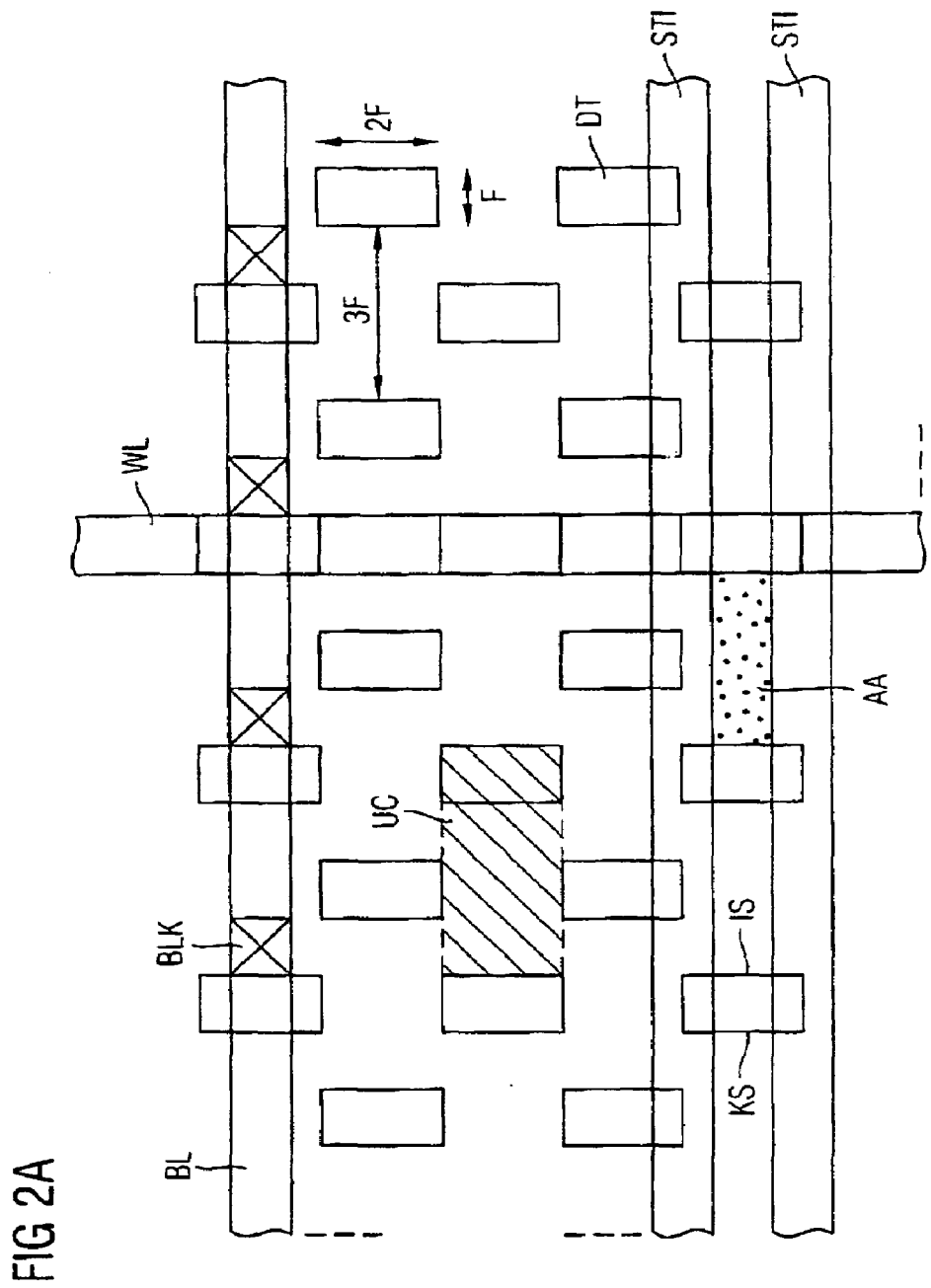
FIGS. 2A, B show a respective plan view of a memory cell array with memory cells in accordance with FIG. 1 in a first and second arrangement.
Figure 2B:
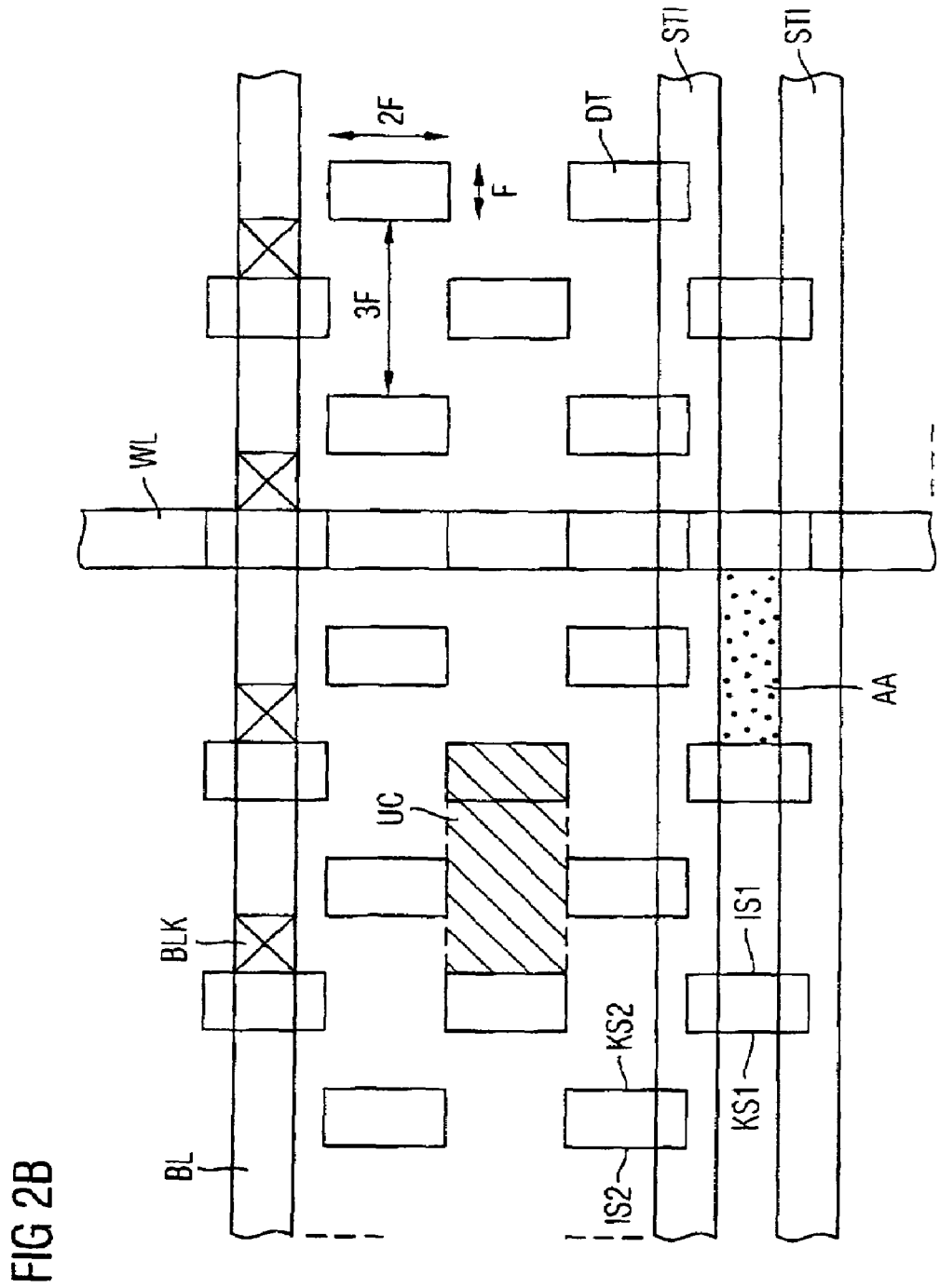
Figure 3A:
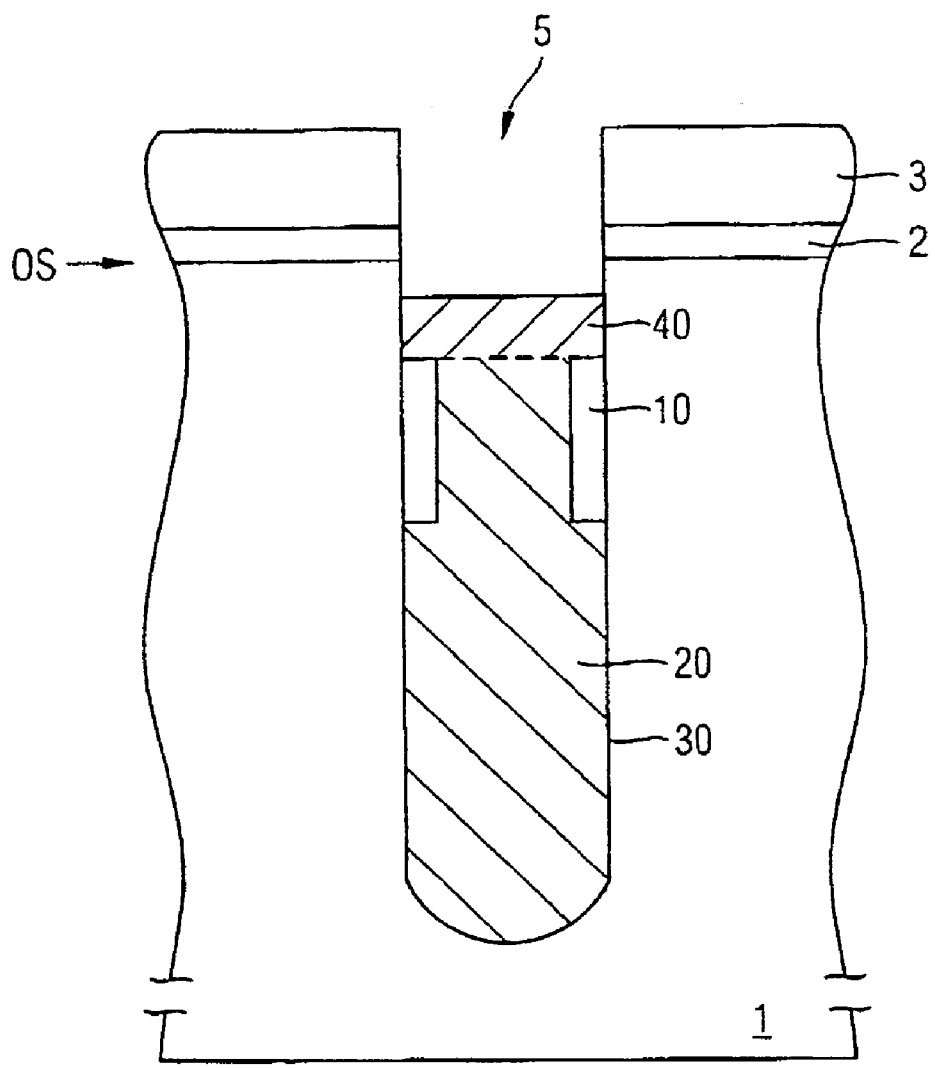
Figure 3B:
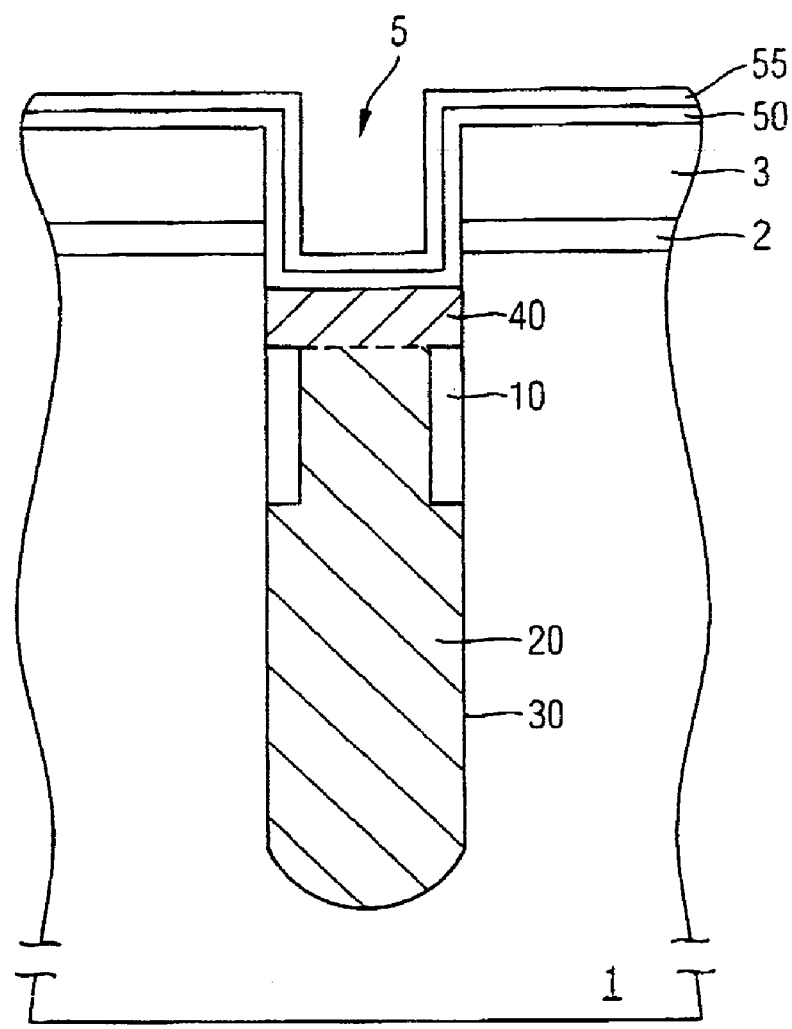
Figure 3C:
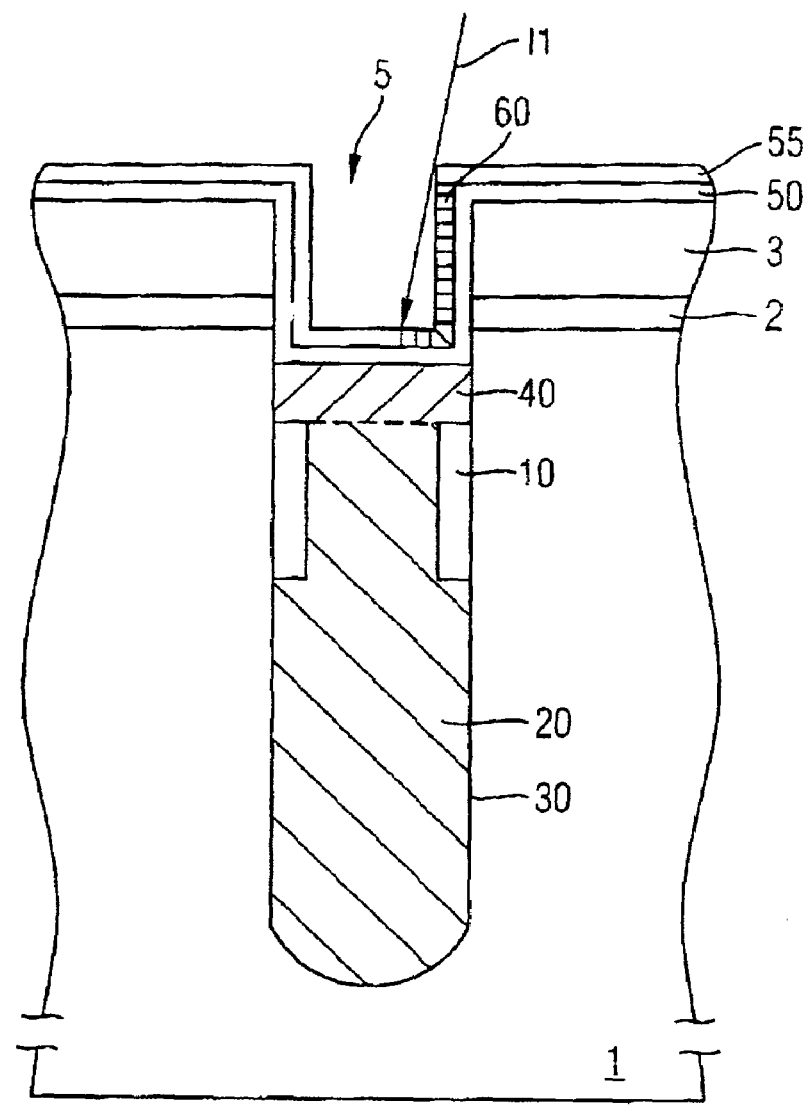
Figure 3E:
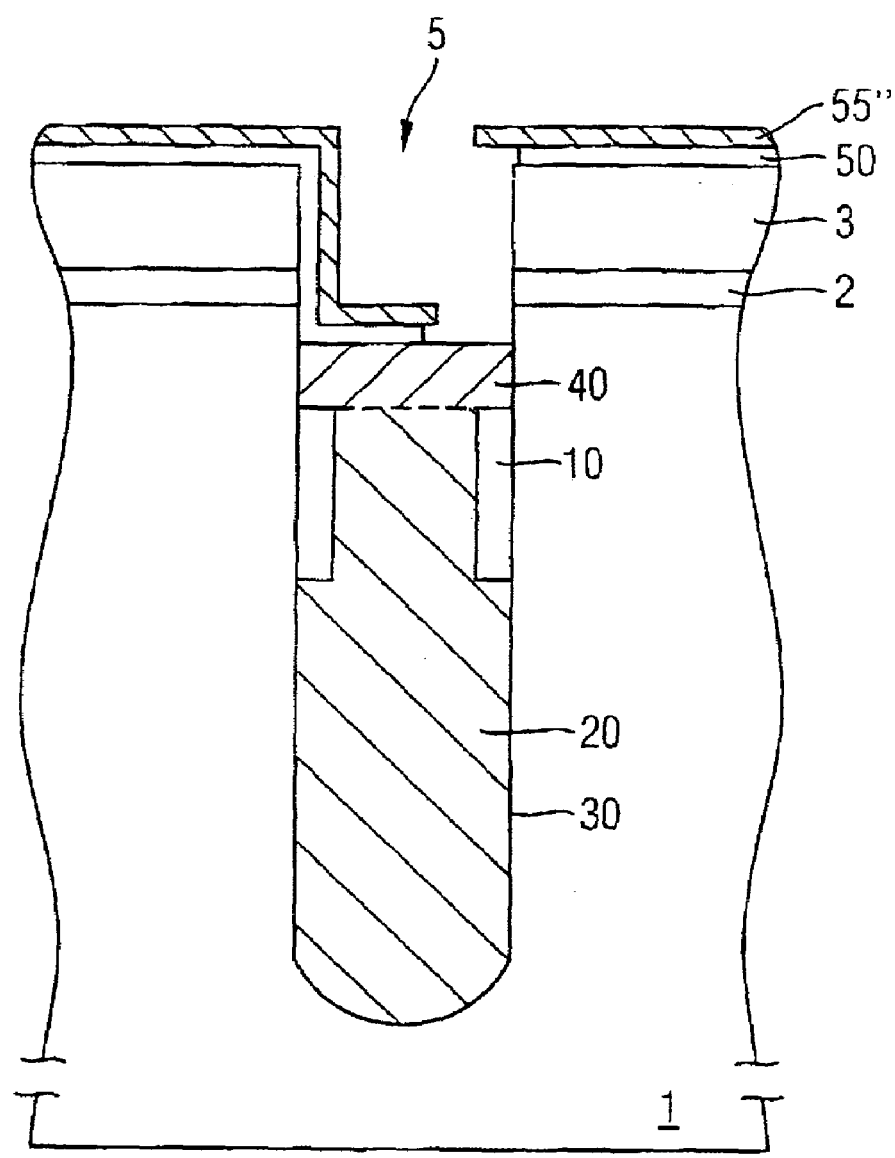
Figure 3G:
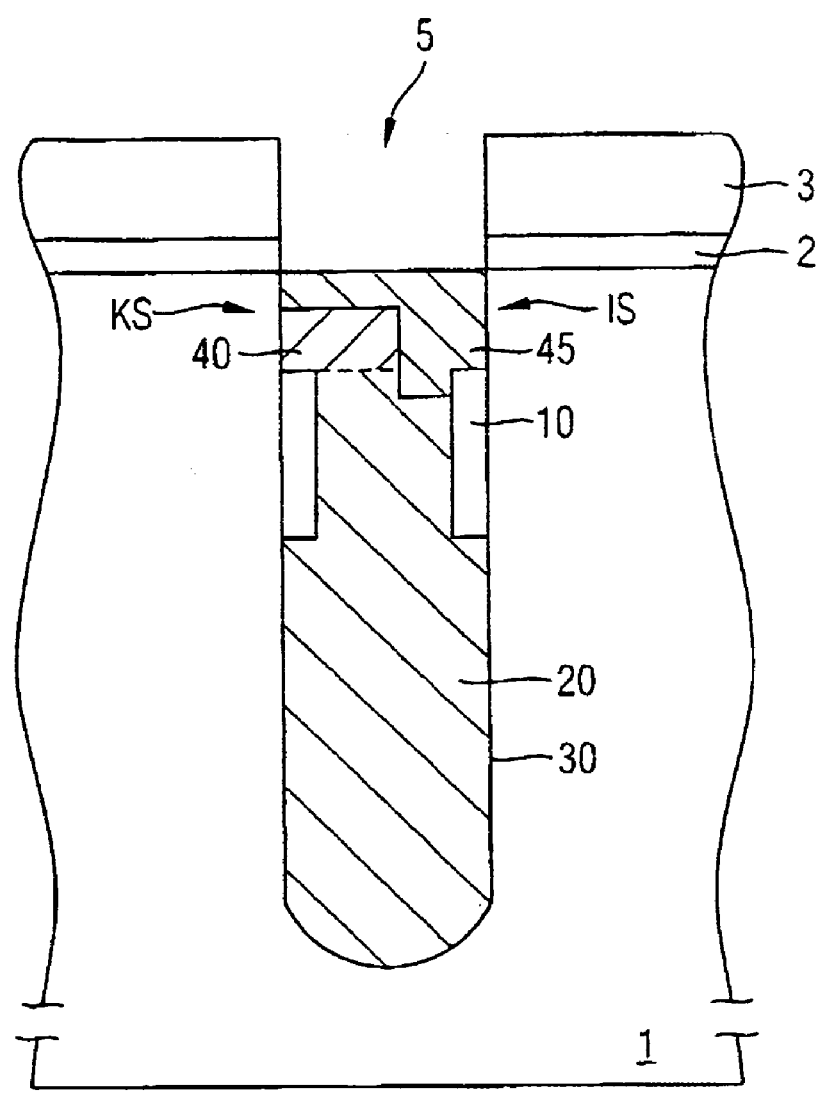
Figure 5A:
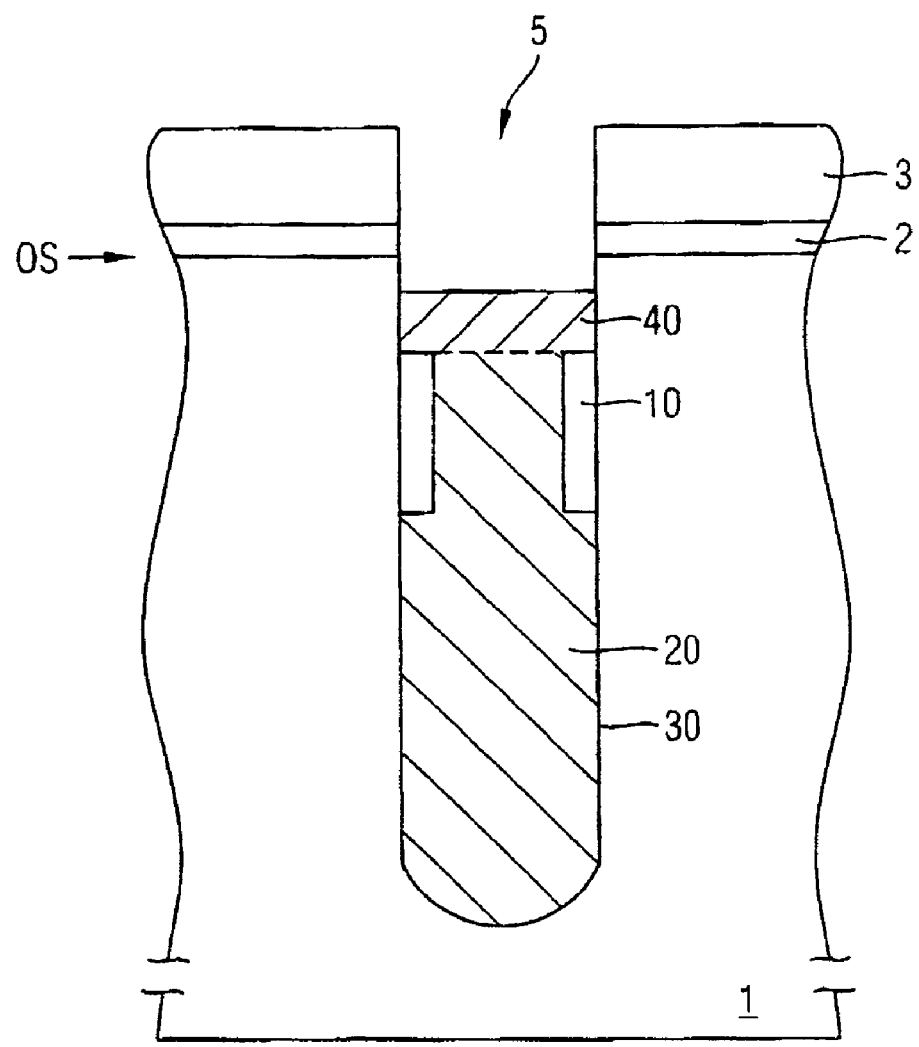
FIGS. 5A–F show illustrations of successive method stages of a fabrication method as first embodiment of the present invention.

The process state shown in FIG. 5A corresponds to the process state in accordance with FIG. 3A. In order to realize the connection on one side of the region 40 to the semiconductor substrate 1, the "subtractive" method steps portrayed below are carried out, which differ from the first example above in particular with regard to the liner technology.

Figure 5B:
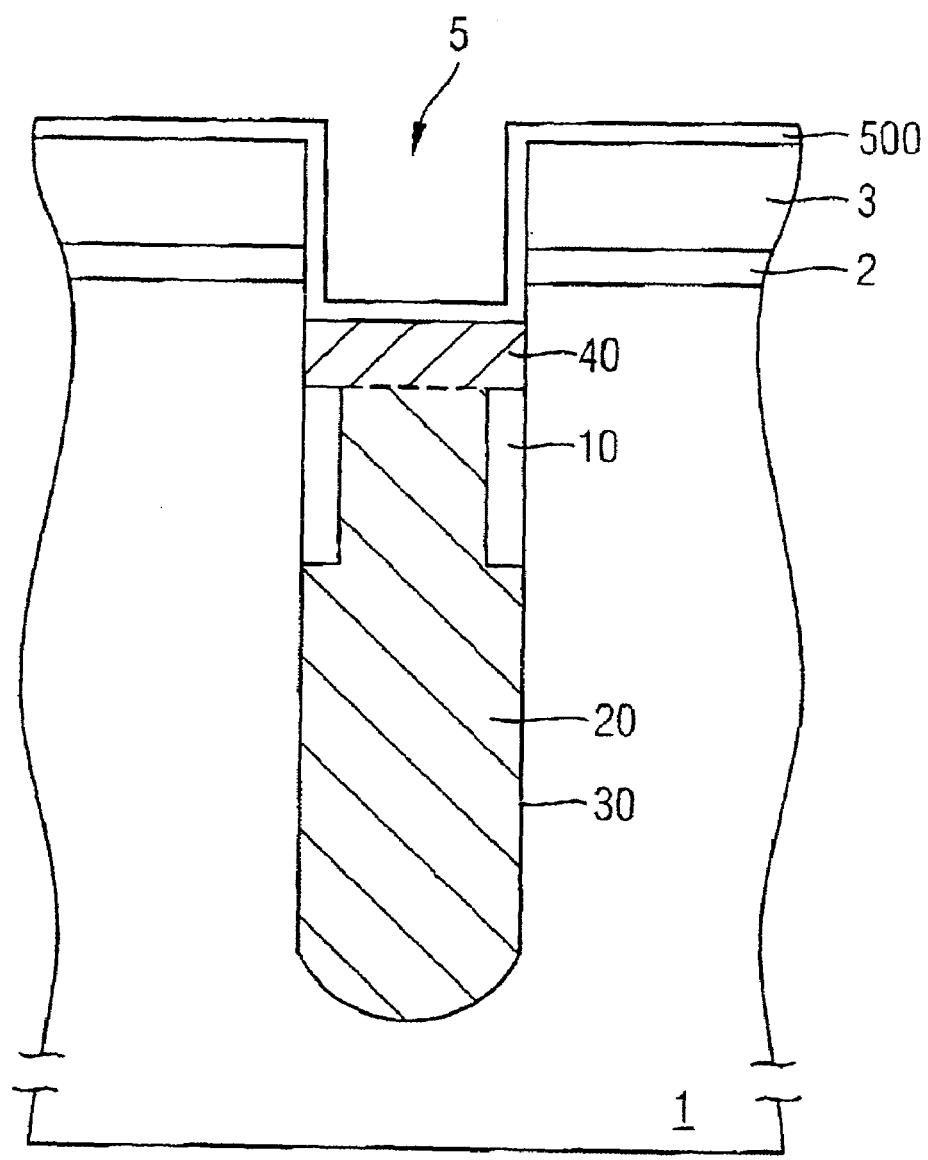

In accordance with FIG. 5B, an $Al_2O_3$ liner having a thickness of approximately 15 nm is deposited in a single layer, e.g. by means of an ALD method, and subjected to heat treatment in order to increase the crystallinity.

Figure 5C:
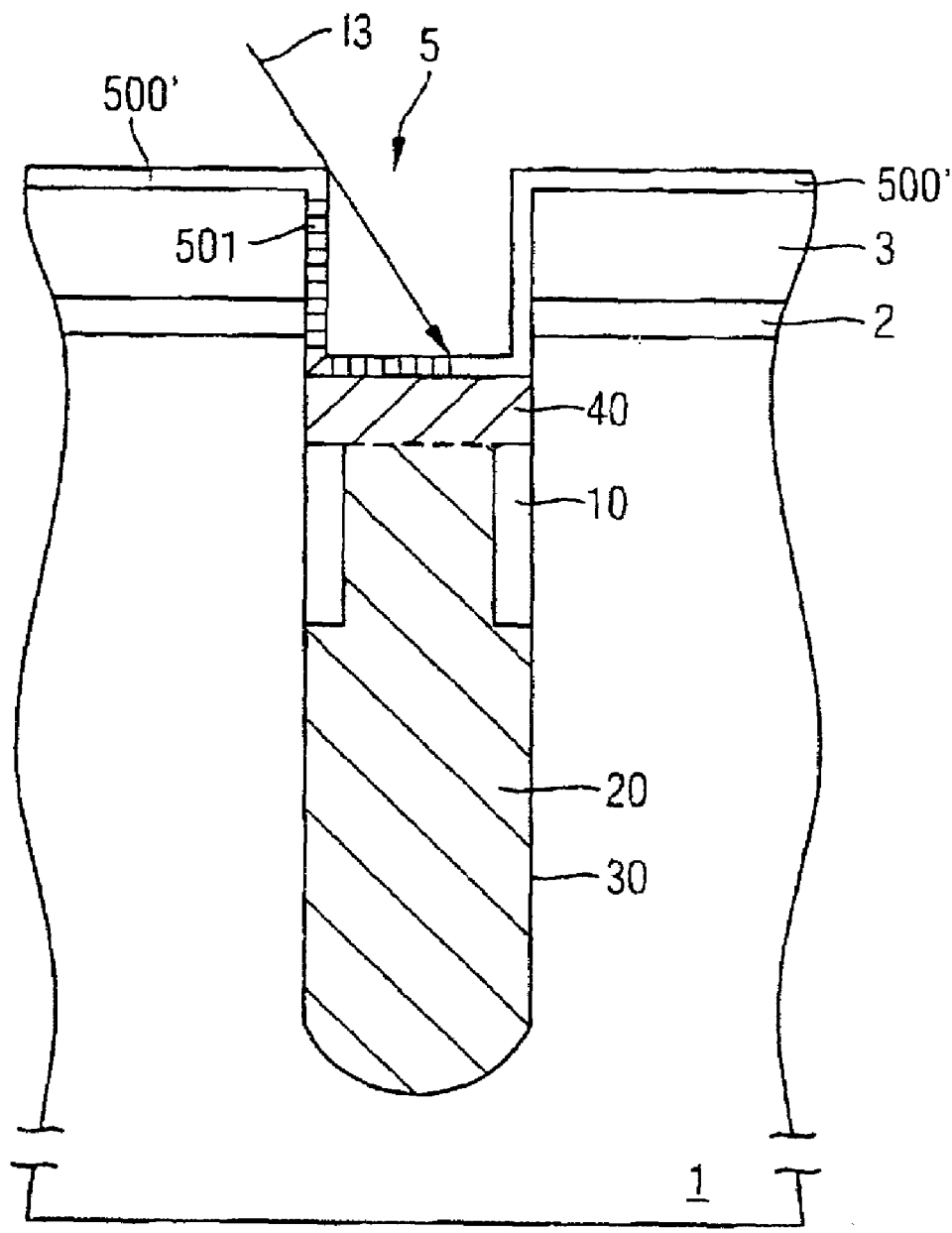

Afterward, with reference to FIG. 5C, an oblique implantation 13 is effected at a predetermined angle, for example 30°, xenon being implanted into the region 500' of the liner 500 with the exception of a shaded region 501. The etching properties of the xenon-doped region 500' of the liner 500 are thus altered, namely the etching rate in an ammonia-containing etchant increases greatly depending on the ion energy, e.g. by a factor of 10 at 40 keV.

Figure 5D:
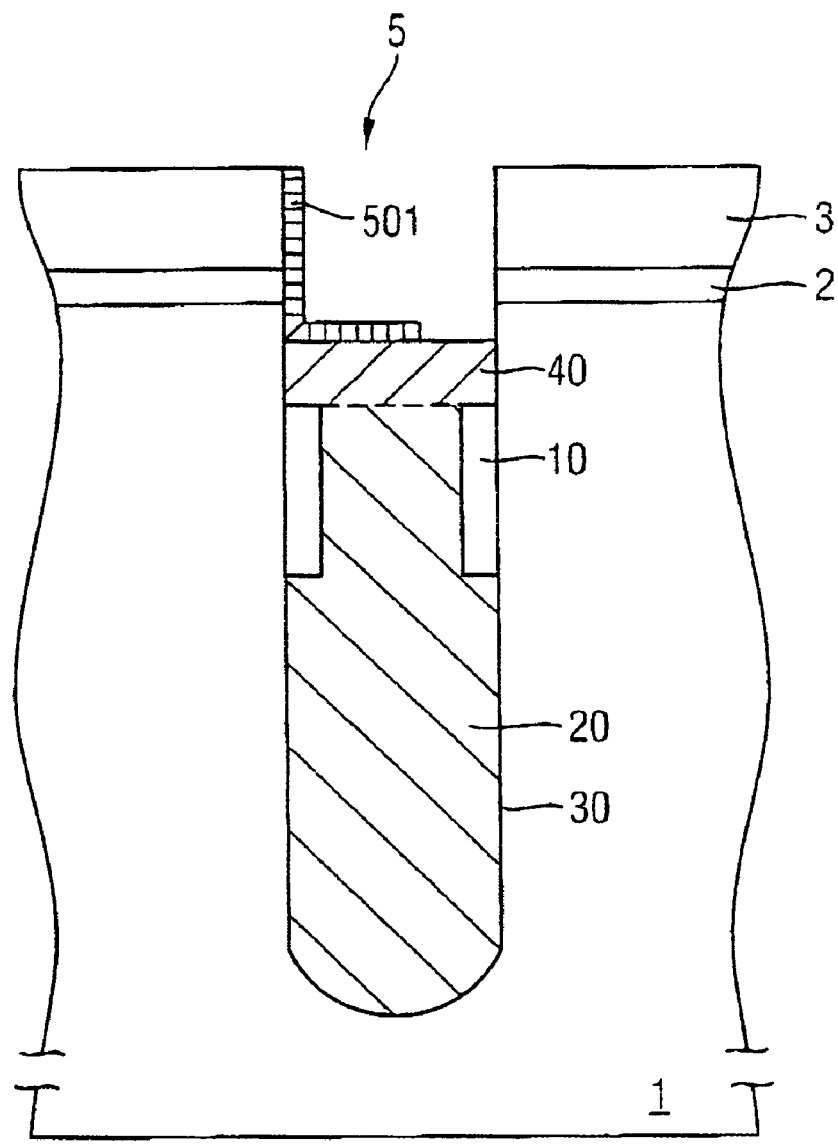

This is utilized in accordance with FIG. 5D by the region 500' being selectively removed by means of a corresponding wet etching method in an ammonia-containing etchant in order to uncover the underlying conductive region 40.

Figure 5E:
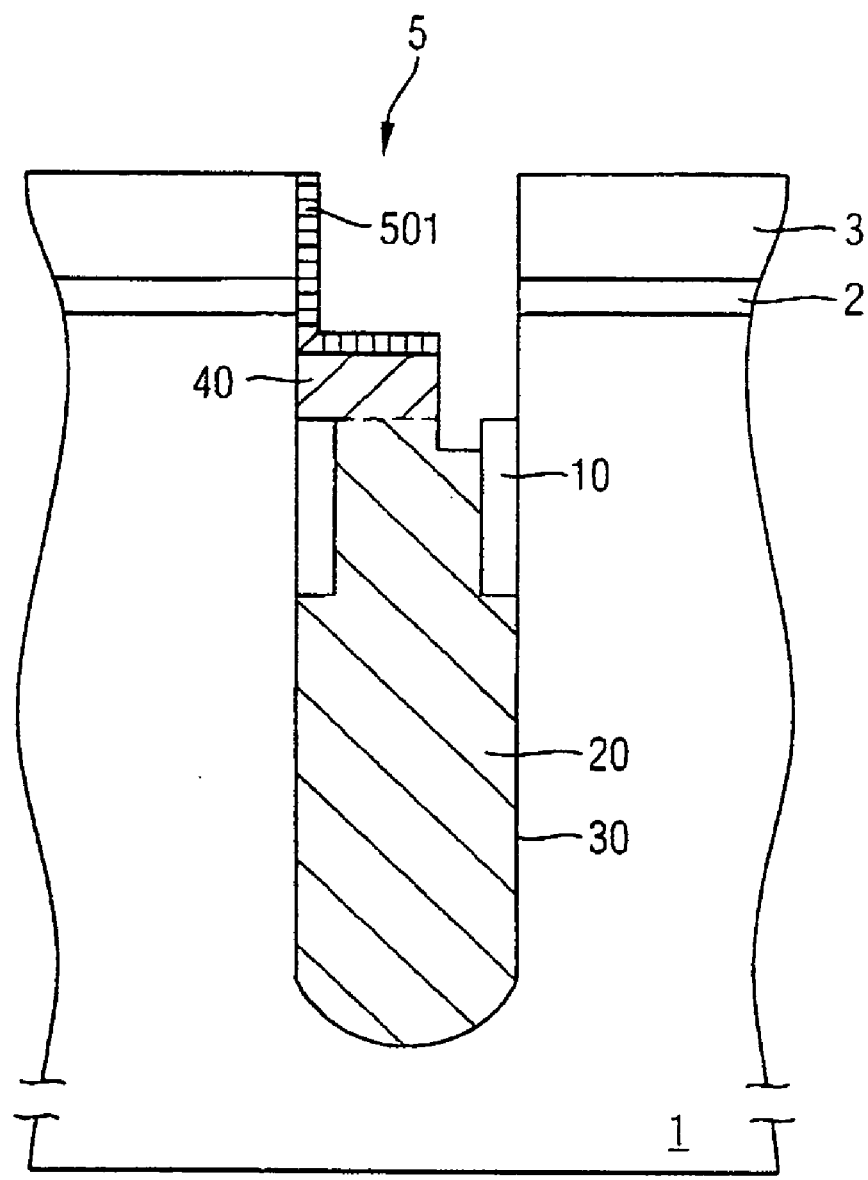

With reference to FIG. 5E, the conductive filling 40 and a part of the conductive filling 20 are then etched using the region 501 as a mask.

In the case of the process state shown in FIG. 5E, a part of the conductive region 40 serving as buried contact is thus removed and a corresponding upwardly and laterally insulating oxide filling 45 can then be provided at the corresponding location in the further course of the method by deposition and etching-back.

For this purpose, the region 501 of the liner 500 is selectively removed from the surface beforehand, which is done either by means of a renewed xenon implantation and etching in an ammonia-containing etchant or by means of an etching in hot phosphoric acid without a renewed xenon implantation.

Figure 5F:
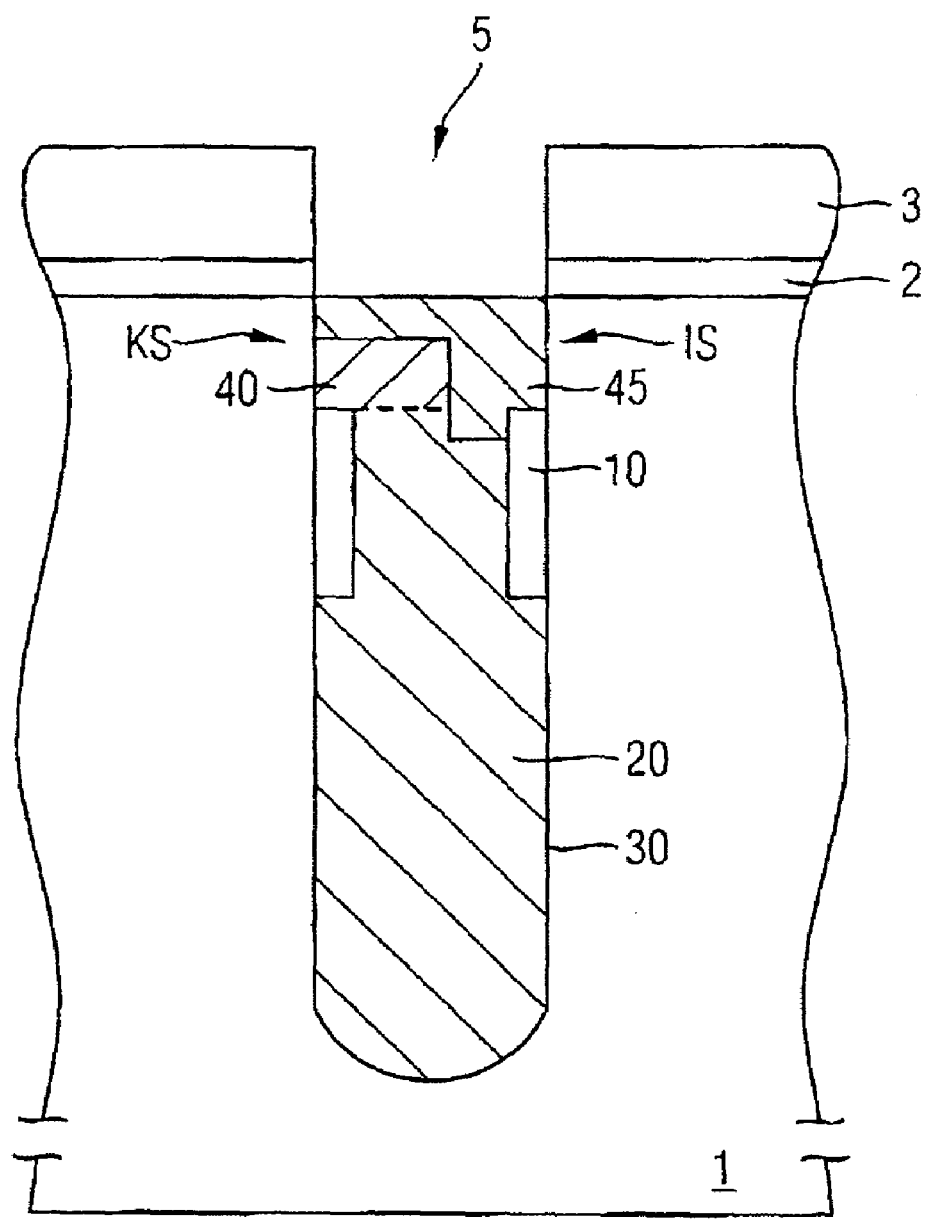

Subsequent filling with an insulating oxide filling 45 and etching-back thereof creates the buried contact with the connection region KS and the insulation region IS as is shown in FIG. 5F.

FIGS. 6A–G show successive method stages of a fabrication method as second embodiment of the present invention.

Figure 4B:
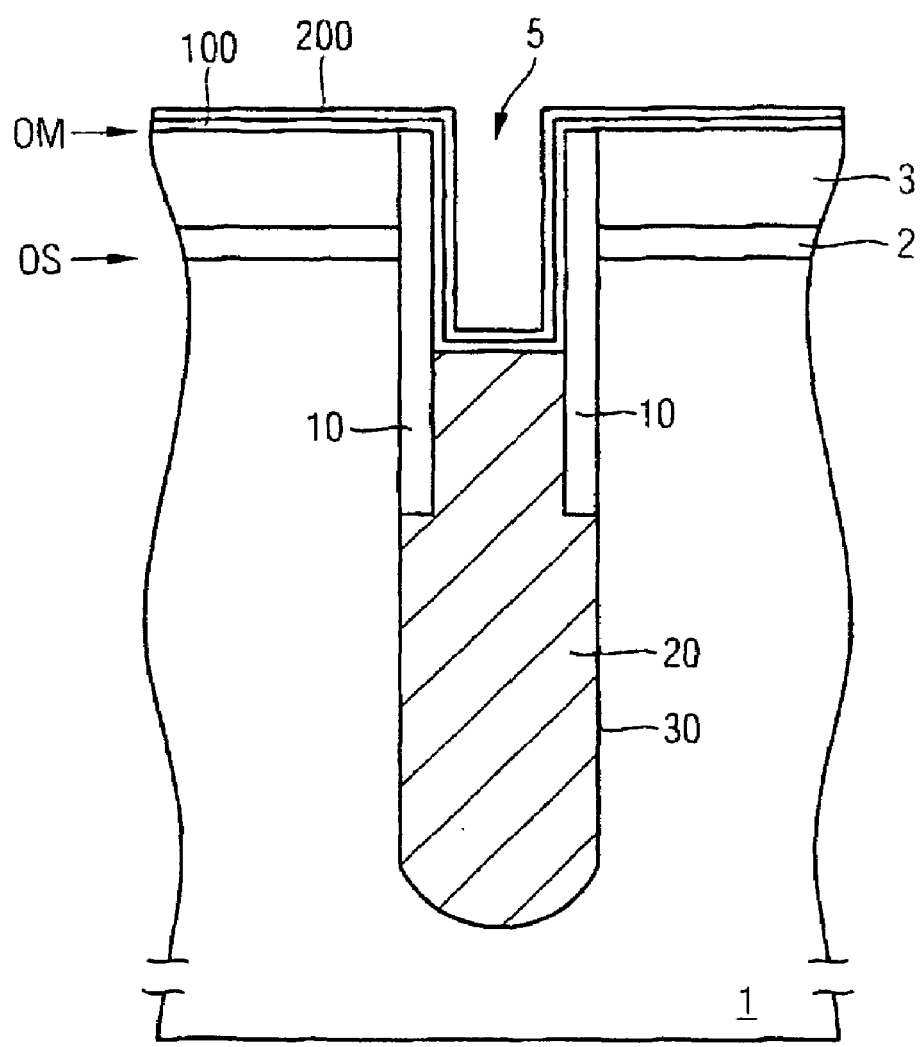
Figure 4C:
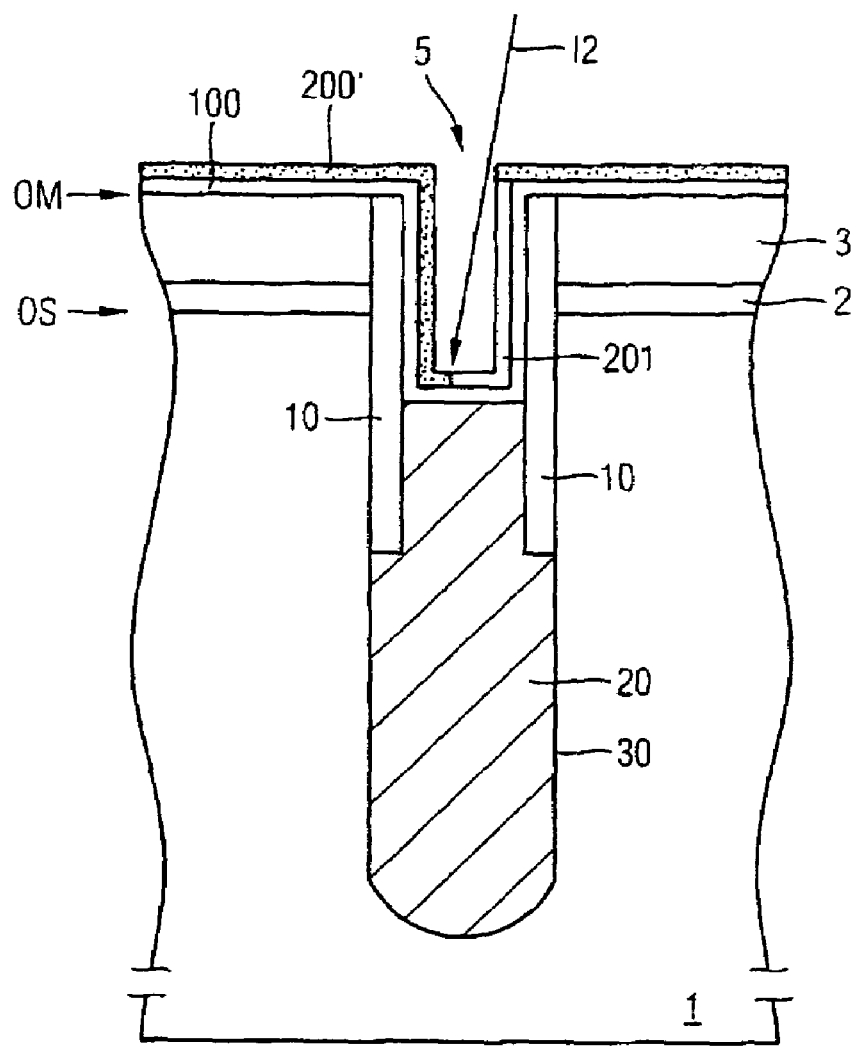
Figure 4D:
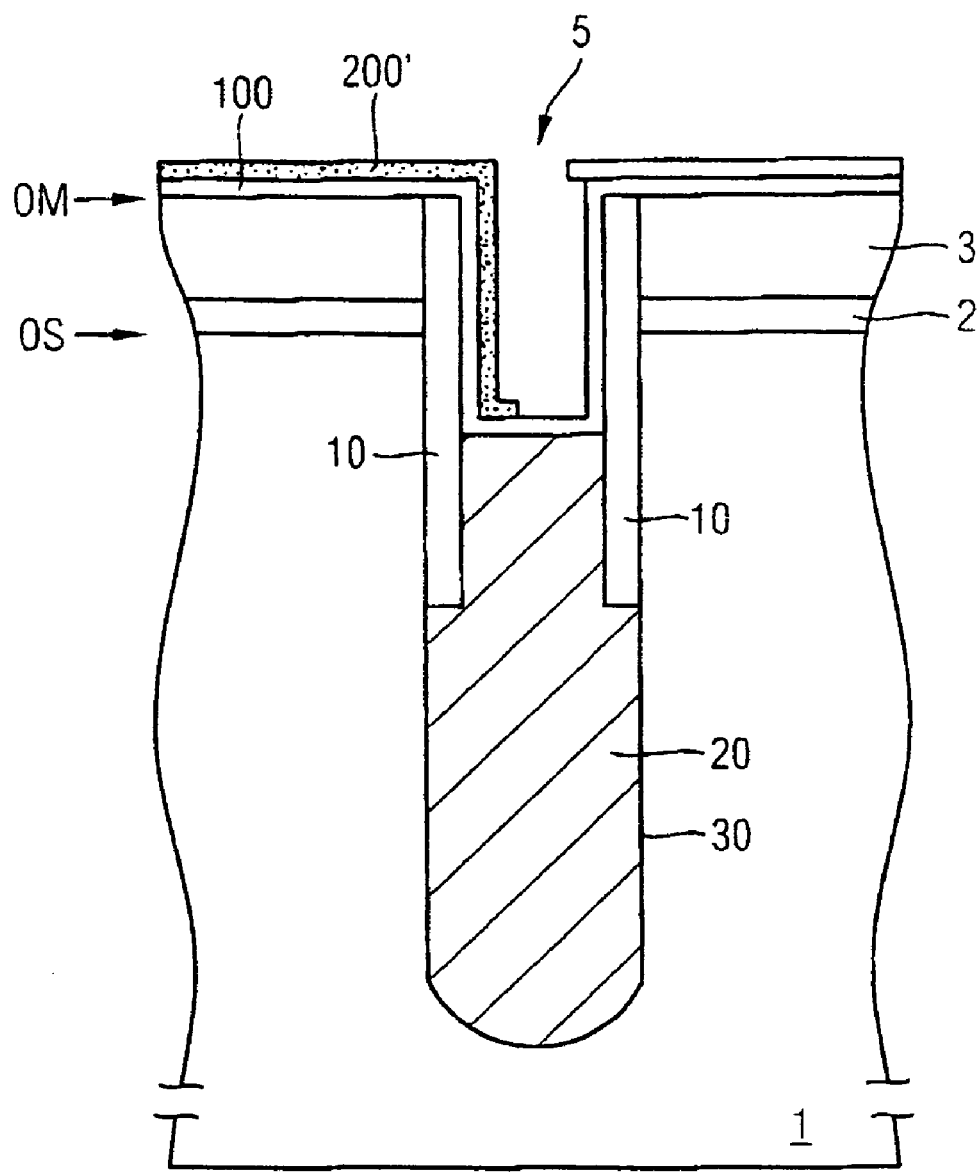
Figure 4F:
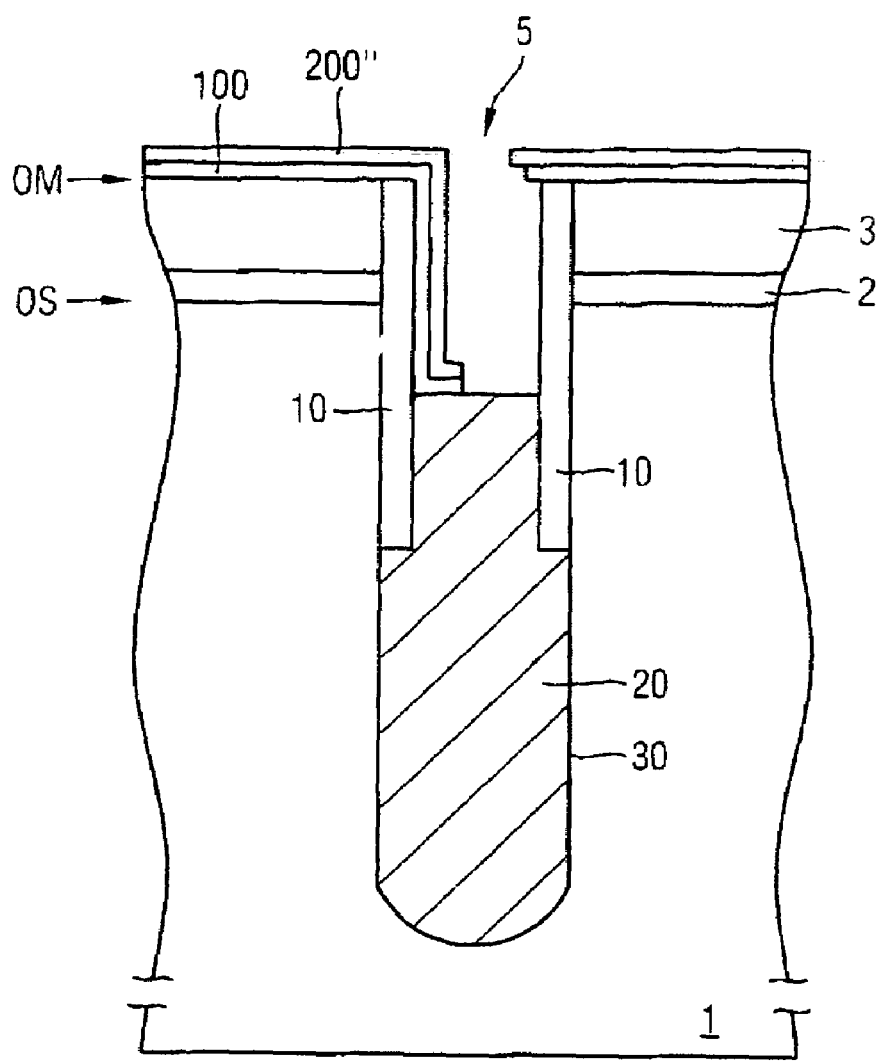
Figure 4I:
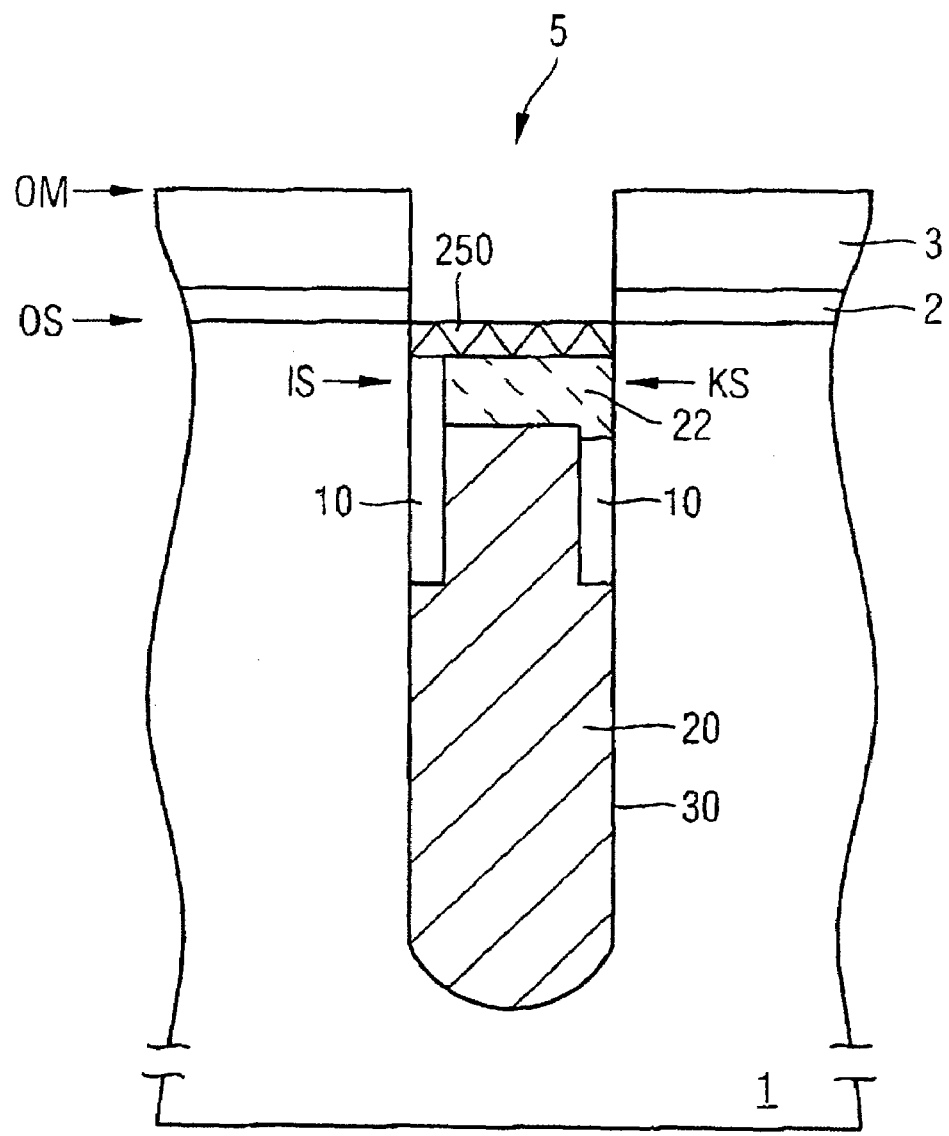
Figure 6A:
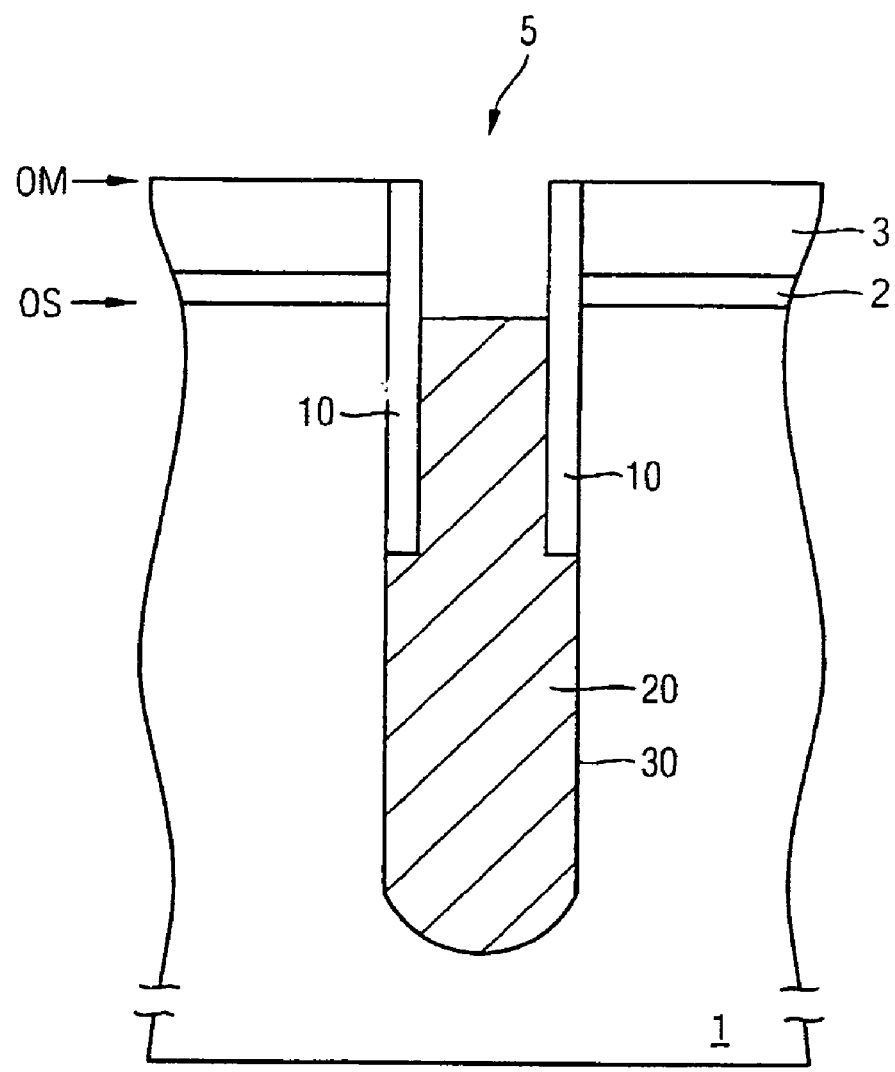

The process state shown in FIG. 6A corresponds to the process state in accordance with FIG. 4A. In order to realize the connection on one side of the region 40 to the semiconductor substrate 1, the "additive" method steps portrayed below are carried out, which differ from the second example above in accordance with FIG. 4 in particular with regard to the liner technology.

Figure 6B:
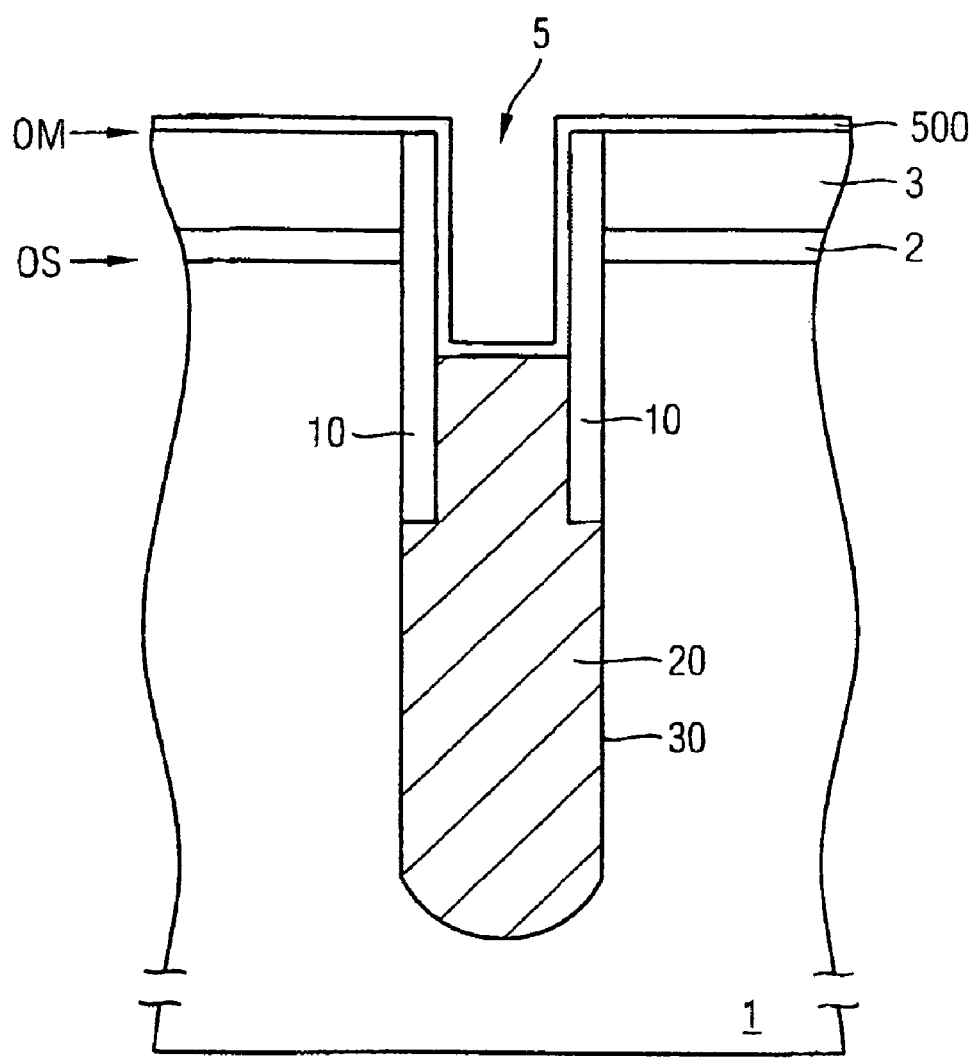

In accordance with FIG. 6B, an $Al_2O_3$ liner having a thickness of approximately 15 nm is deposited in a single layer, e.g. by means of an ALD method, and subjected to heat treatment in order to increase the crystallinity.

Figure 6C:
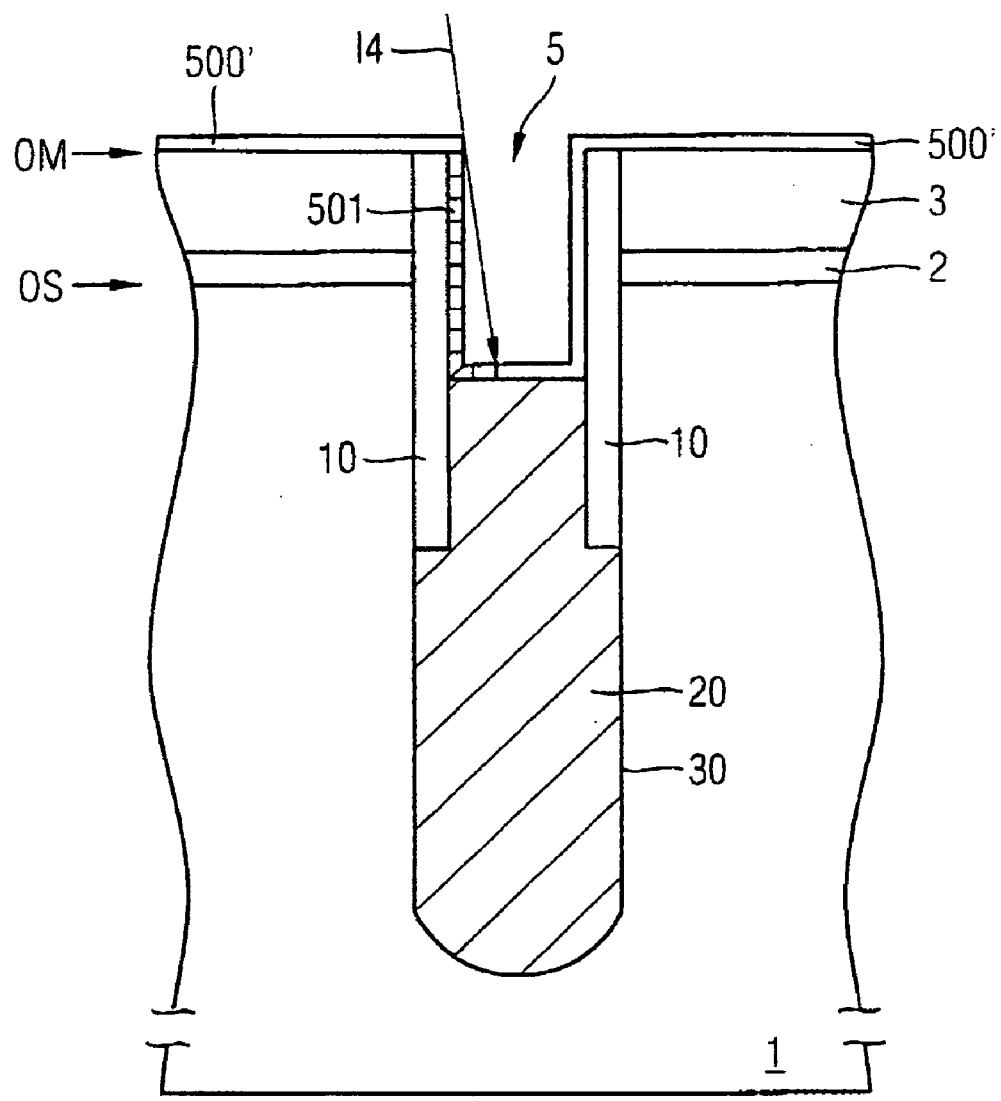

Afterward, with reference to FIG. 6C, an oblique implantation 14 is effected at a predetermined angle, for example 30°, xenon being implanted into the region 500' of the liner 500 with the exception of a shaded region 501. The etching properties of the xenon-doped region 500' of the liner 500 are thus altered, namely the etching rate in an ammonia-containing etchant increases greatly depending on the ion energy, e.g. by a factor of 10 at 40 keV.

Figure 6D:
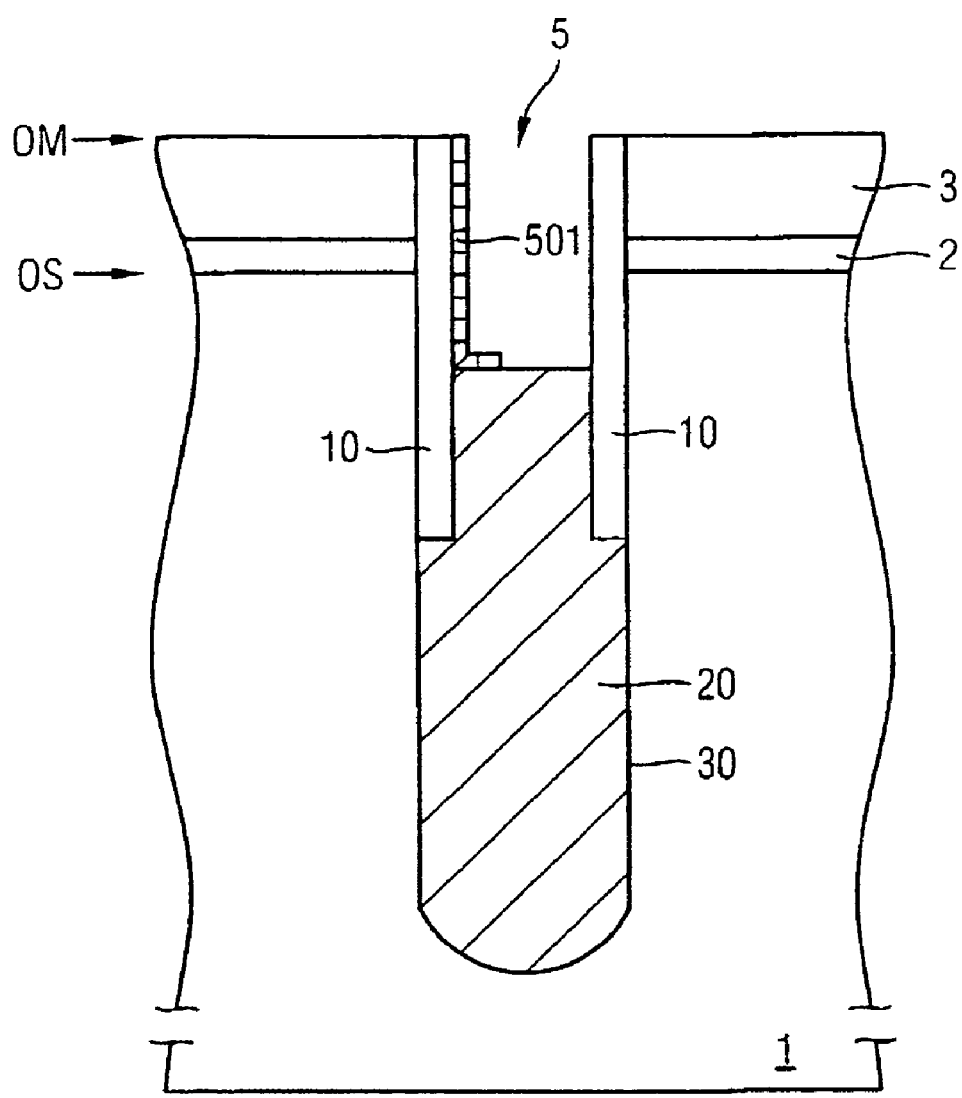

This is utilized in accordance with FIG. 6D by the region 500' being selectively removed by means of a corresponding wet etching method in an ammonia-containing etchant in order to uncover the underlying conductive region of the filling 20 and the insulation collar 10.

Figure 6E:
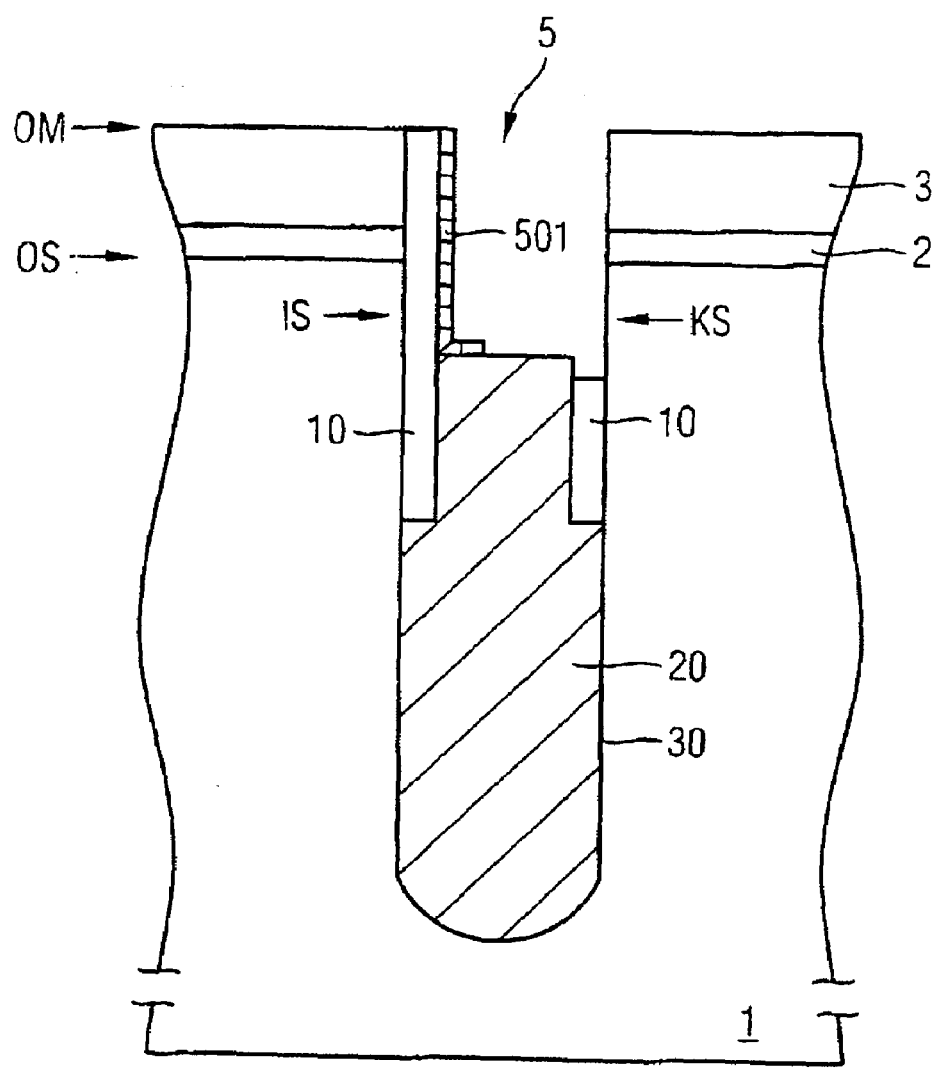

With reference to FIG. 6E, a selective wet-etching for removing silicon oxide is then effected in order to remove the insulation collar 10 uncovered in the recess. This creates a connection region KS on one side in the trench 5 toward the silicon semiconductor substrate 1. An insulation region IS is provided on the other side, where the insulation collar 10 remains, as shown in FIG. 6E. Although not shown here, the surface of the connection region KS is usually conditioned at this point, for example by means of a further implantation.

With reference to FIG. 6F, a further electrically conductive filling 22 made of polysilicon is then deposited and etched back, so that the previously existing recess is filled again as far as the top side OM of the hard mask.

In subsequent process steps known per se, the insulation collar 10 is then sunk in the insulation region IS and in the further electrically conductive filling 22 to below the top side OS of the semiconductor substrate 1 and an insulation region 250 is deposited and sunk, said insulation region likewise preferably comprising silicon oxide.

Figure 6G:
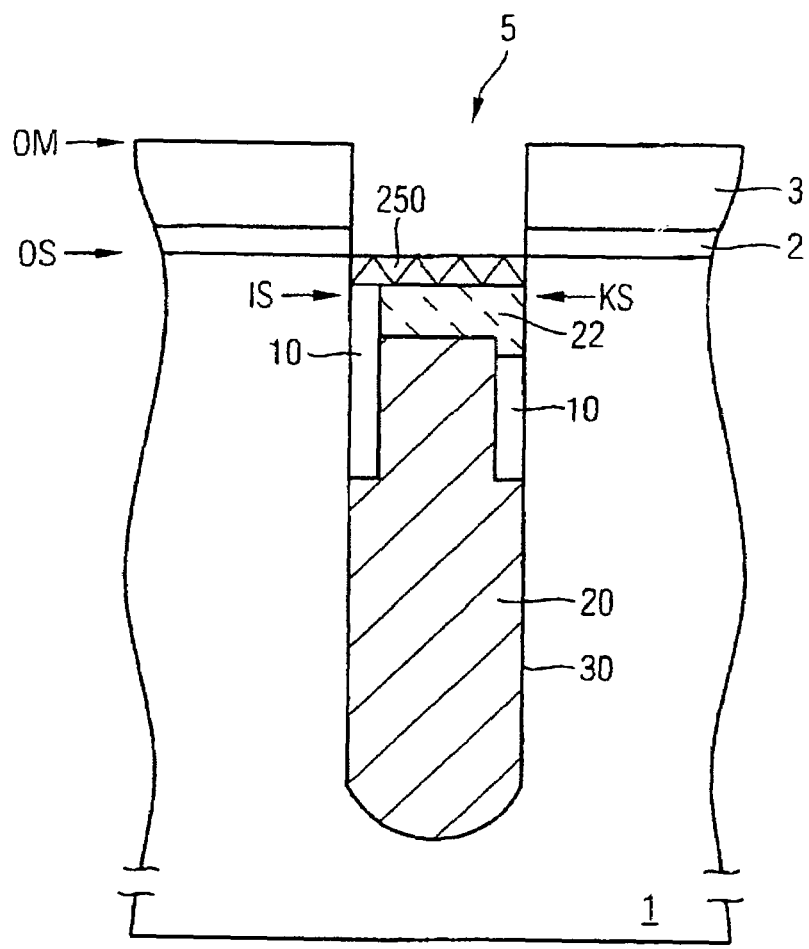

Thus, the trench capacitor shown in FIG. 6G is with the buried contact with the connection region KS and the insulation region IS.

Although the present invention has been described above on the basis of a preferred exemplary embodiment, it is not restricted thereto, but rather can be modified in diverse ways.

In particular, the selection of the layer materials is only by way of example and can be varied in many different ways.

What is claimed is:

1. A method for fabricating a trench capacitor with an insulation collar in a substrate, which is electrically connected to the substrate on one side via a buried contact, comprising:
    providing a trench in the substrate using a hard mask with a corresponding mask opening;
    providing an at least partial trench filling;
    providing a liner comprising $Al_2O_3$ on the resulting structure;
    subjecting the liner to a heat treatment for increasing the crystallinity of the liner;
    carrying out an oblique implantation of impurity ions onto the liner for the purpose of altering the etching properties of an implanted partial region of the liner;
    selectively removing the implanted partial region of the liner by means of a first etching for the purpose of forming a liner mask from a complimentary partial region of the liner, which partially masks a top side of the trench filling;
    removing a part of the trench filling by means of a second etching using the liner mask; and
    replacing the removed part of the trench filling.

2. The method according to claim 1, wherein for the trench filling,
    provision is made of a capacitor dielectric in a lower and central trench region, an insulation collar in the central and upper trench region and an electrically conductive filling in the lower, central and upper trench region, the electrically conductive filling electrically contact-connecting the substrate in the upper trench region above the insulation collar and being sunk with respect to the top side of the substrate;
    the liner mask defines a contact region on one side and an insulation region on a different side of a buried contact; and
    the insulation region of the buried contact is formed by replacing the removed part of the trench filling by an insulation material.

3. The method according to claim 1, wherein for the trench filling,
    provision is made of a capacitor dielectric in a lower and central trench region, an insulation collar in the central and upper trench region and as far as a top side of the hard mask opening, and an electrically conductive filling in the trench, which filling reaches as far as at least into the upper trench region with the insulation collar;
    the liner mask defines a contact region on one side and an insulation region on a different side of a buried contact; and
    the contact region of the buried contact is formed by replacing the removed part of the trench filling by a further electrically conductive filling.

4. The method according to claim 1, wherein the liner mask is removed before replacement of the removed part of the trench filling.

5. The method according to claim 4, wherein, for removal, an oblique implantation of impurity ions onto the liner mask is performed for of altering the etching properties and the liner mask is subsequently removed by a third etching.

6. The method according to claim 1, wherein the liner has a thickness of 15 to 25 nm.

7. The method according to claim 1, wherein the implanted part of the liner is etched in an ammonia-containing etchant.

8. The method according to claim 1, wherein the liner comprises $Al_2O_3$ and the liner mask is removed before replacement of the removed part of the trench filling by means of the hot phosphoric acid.

* * * * *